United States Patent [19]

Muraki et al.

[11] Patent Number: 5,463,497
[45] Date of Patent: Oct. 31, 1995

[54] ILLUMINATION DEVICE INCLUDING AN OPTICAL INTEGRATOR DEFINING A PLURALITY OF SECONDARY LIGHT SOURCES AND RELATED METHOD

[75] Inventors: Masato Muraki, Yokohama; Akiyoshi Suzuki, Tokyo; Shunzo Imai, Yamato, all of Japan

[73] Assignee: Canon Kabushiki Kaisha, Tokyo, Japan

[21] Appl. No.: 261,229

[22] Filed: Jun. 16, 1994

Related U.S. Application Data

[60] Continuation of Ser. No. 918,005, Jul. 24, 1992, abandoned, which is a division of Ser. No. 534,246, Jun. 7, 1990, Pat. No. 5,153,773.

[30] Foreign Application Priority Data

| Jun. 8, 1989 | [JP] | Japan | 1-146216 |
| Jan. 20, 1990 | [JP] | Japan | 2-011534 |
| Mar. 1, 1990 | [JP] | Japan | 2-050587 |

[51] Int. Cl.$^6$ .............................. G02B 27/10; F21K 7/00
[52] U.S. Cl. ......................... 359/618; 359/619; 362/259; 362/268
[58] Field of Search ........................... 359/618, 619, 359/638, 639, 640, 621, 622, 623; 362/259, 268

[56] References Cited

U.S. PATENT DOCUMENTS

| 3,670,260 | 6/1972 | Koester et al. | 331/94.5 |
| 4,367,009 | 1/1983 | Suzki | 360/6.5 |
| 4,370,026 | 1/1983 | Dubroeucq et al. | 350/163 |
| 4,458,994 | 7/1984 | Jain et al. | 354/4 |
| 4,497,013 | 1/1985 | Ohta | 362/32 |
| 4,497,015 | 1/1985 | Konno et al. | 362/268 |
| 4,498,742 | 2/1985 | Uehara | 350/523 |
| 4,619,508 | 10/1986 | Shibuya et al. | 353/122 |
| 4,793,694 | 12/1988 | Liu | 350/379 |
| 4,811,328 | 3/1989 | Ito et al. | 369/112 |
| 4,851,978 | 7/1989 | Ichihara | 362/268 |
| 4,918,583 | 4/1990 | Kudo et al. | 362/268 |
| 4,939,630 | 7/1990 | Kikuchi et al. | 362/268 |
| 4,974,919 | 12/1990 | Muraki et al. | 350/6.6 |
| 5,016,149 | 5/1991 | Tanaka et al. | 362/259 |
| 5,048,926 | 9/1991 | Tamimoto | 359/618 |
| 5,091,744 | 2/1992 | Omata | 355/53 |

FOREIGN PATENT DOCUMENTS

| 31969 | 4/1973 | Japan . |
| 111832 | 9/1979 | Japan . |
| 59-226317 | 12/1984 | Japan . |
| 162218 | 8/1985 | Japan . |
| 32555 | 2/1988 | Japan . |

Primary Examiner—Scott J. Sugarman
Assistant Examiner—Michael A. Papalas
Attorney, Agent, or Firm—Fitzpatrick, Cella, Harper & Scinto

[57] ABSTRACT

An illumination device includes a radiation source; an optical integrator having an array of lenses disposed along a plane perpendicular to an optical axis of the device; a first optical system for amplitude-dividing a coherent beam from the radiation source and producing plural beams which are substantially incoherent with each other, the first optical system also being effective to project the beams to the optical integrator in different directions and to superpose the beams upon one another on the optical integrator; and a second optical system for directing beams from the lenses of the optical integrator to a surface to be illuminated and for superposing the beams upon one another on the surface to be illuminated.

38 Claims, 12 Drawing Sheets

|   | TYPE 1 | TYPE 2 | TYPE 3 | TYPE 4 | TYPE 5 | TYPE 6 | TYPE 7 |
|---|---|---|---|---|---|---|---|
| I |  |  |  |  |  |  |  |
| II |  |  |  |  |  |  |  |
| III |  |  |  |  |  |  |  |
| IV |  |  |  |  |  |  |  |
| V | 16 | 9 | 12 | 36 | 72 | 42 | 27 |

FIG. 4

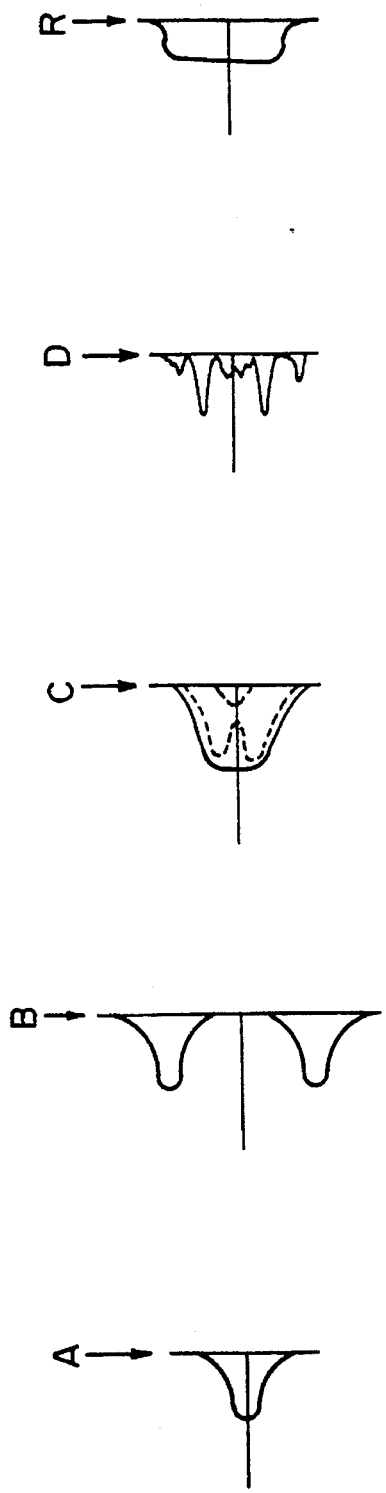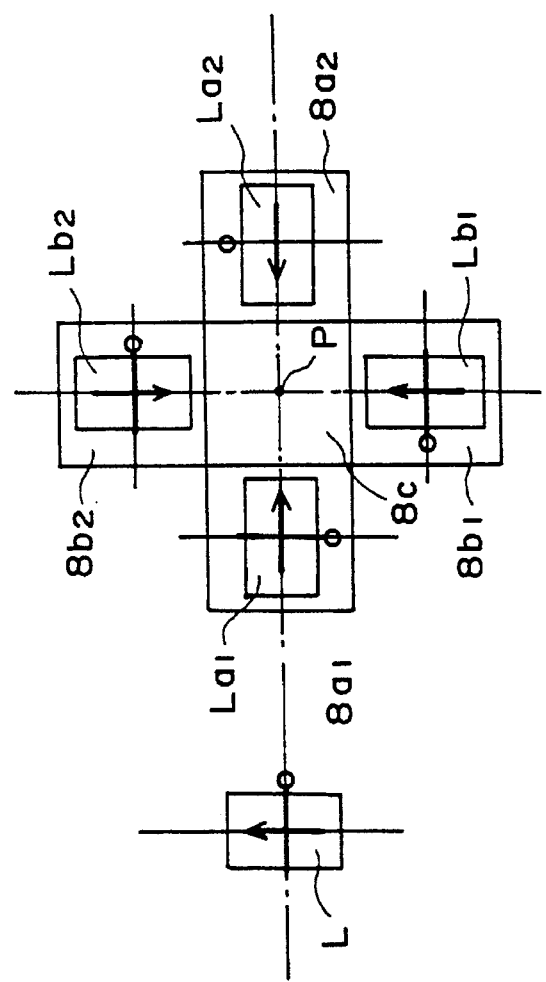
FIG. 6A  FIG. 6B  FIG. 6C  FIG. 6D  FIG. 6E
FIG. 7

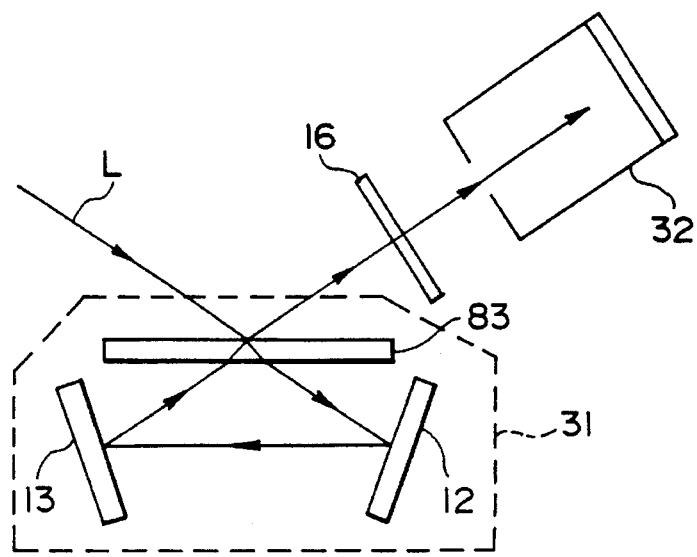
F I G. 10
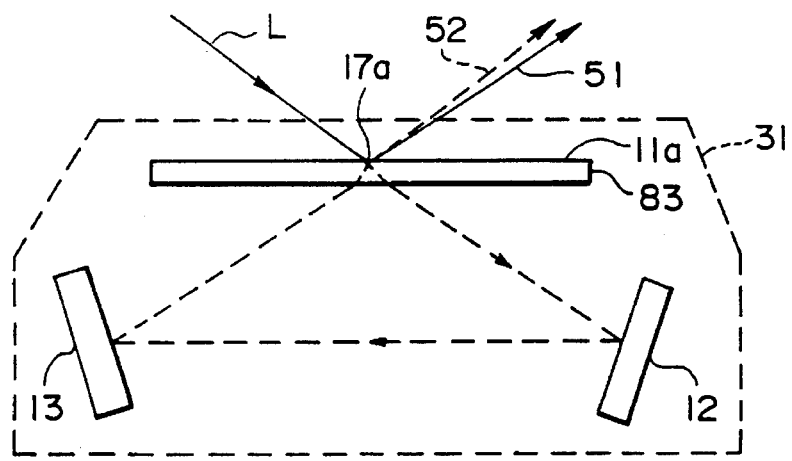
F I G. 11
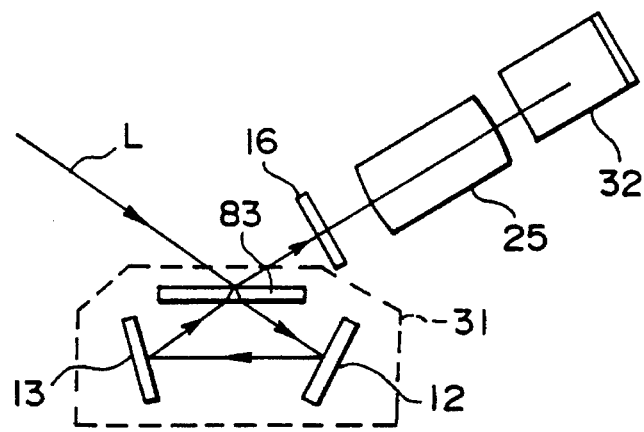
F I G. 12

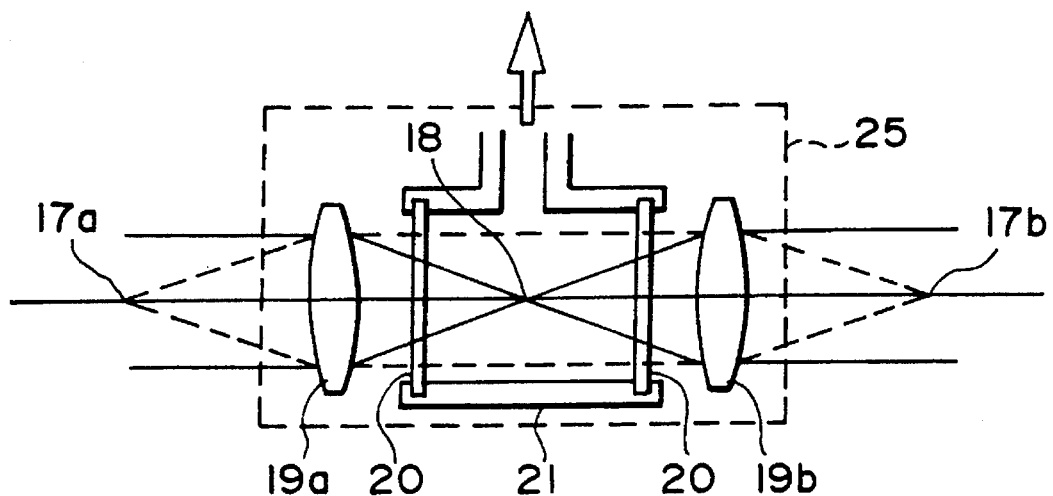
F I G. 13
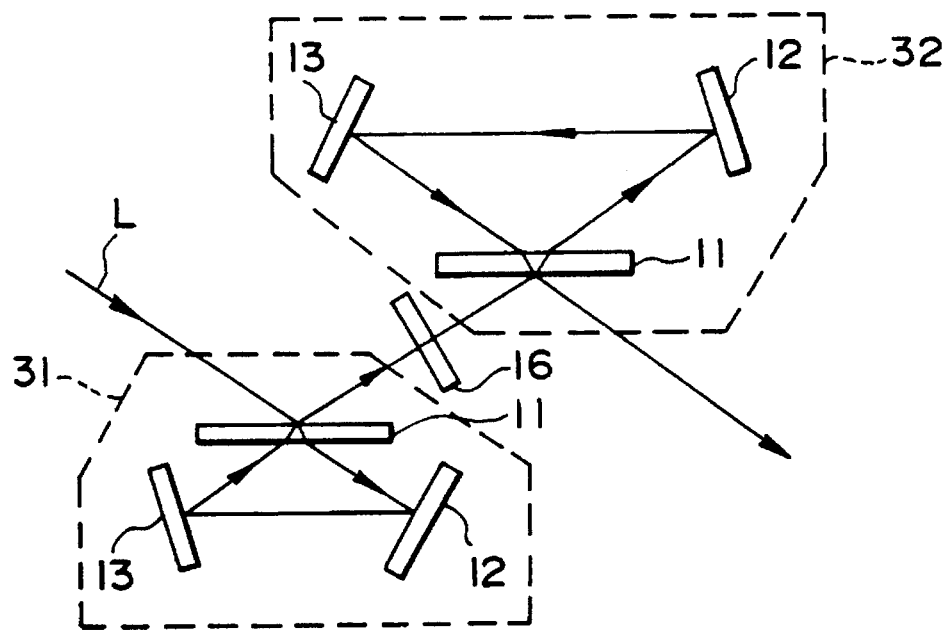
F I G. 14

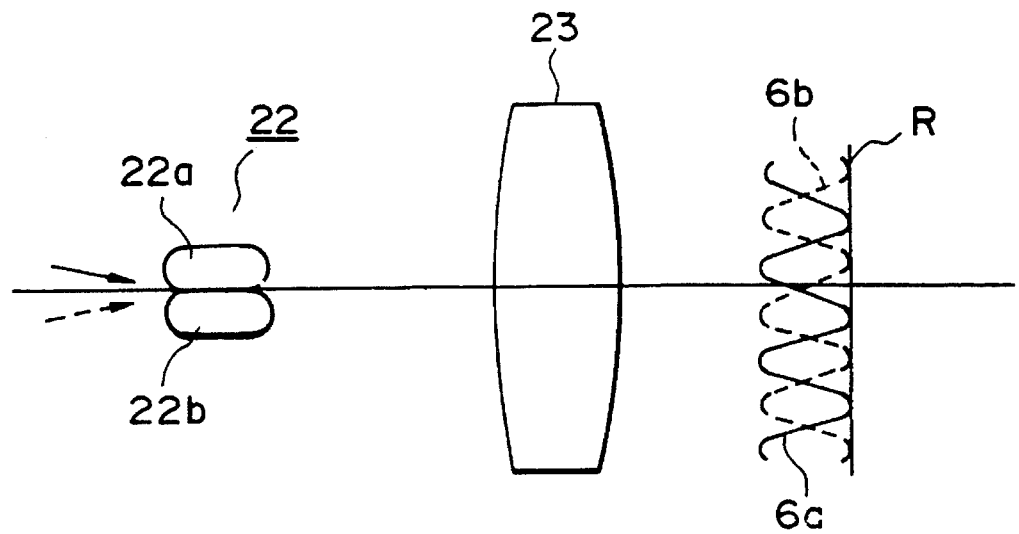
F I G. 15
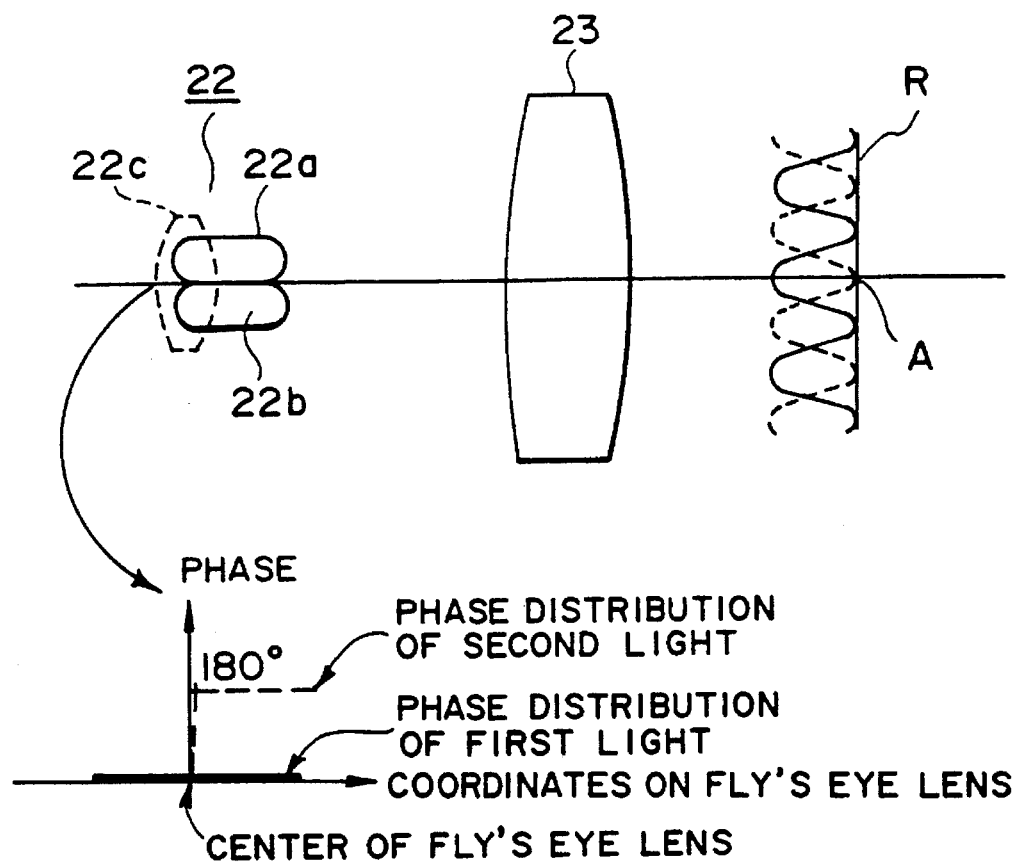
F I G. 16

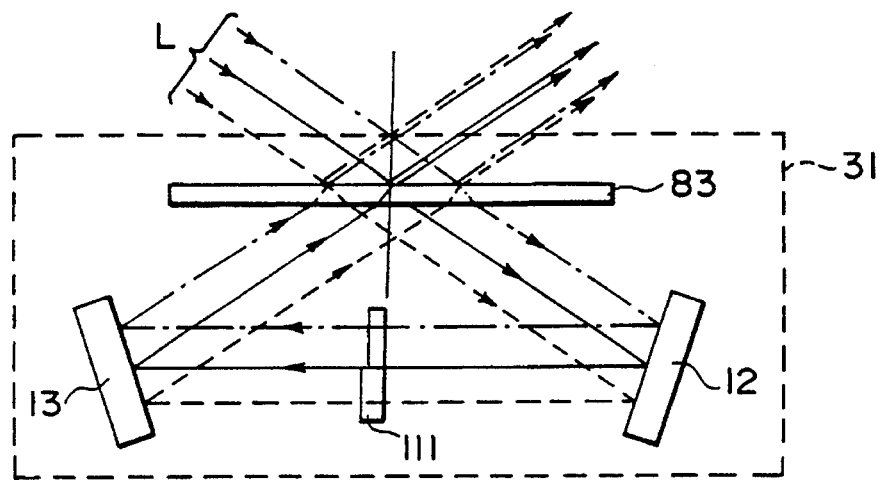
F I G. 17A
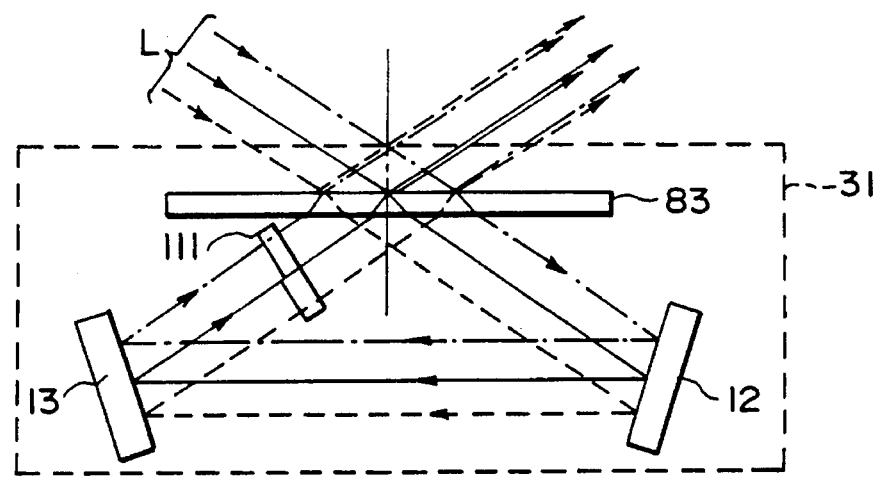
F I G. 17B
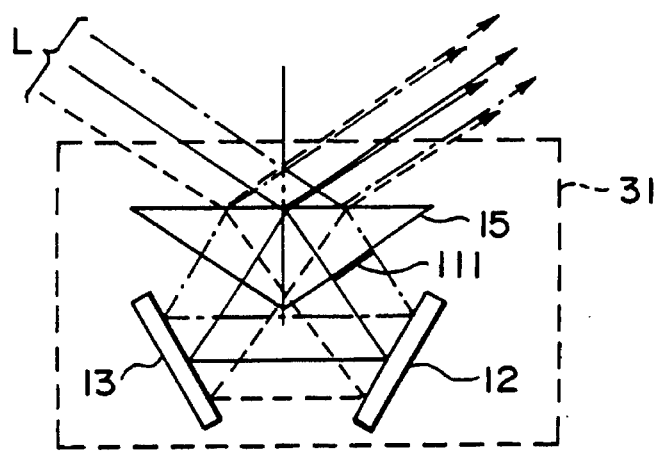
F I G. 17C

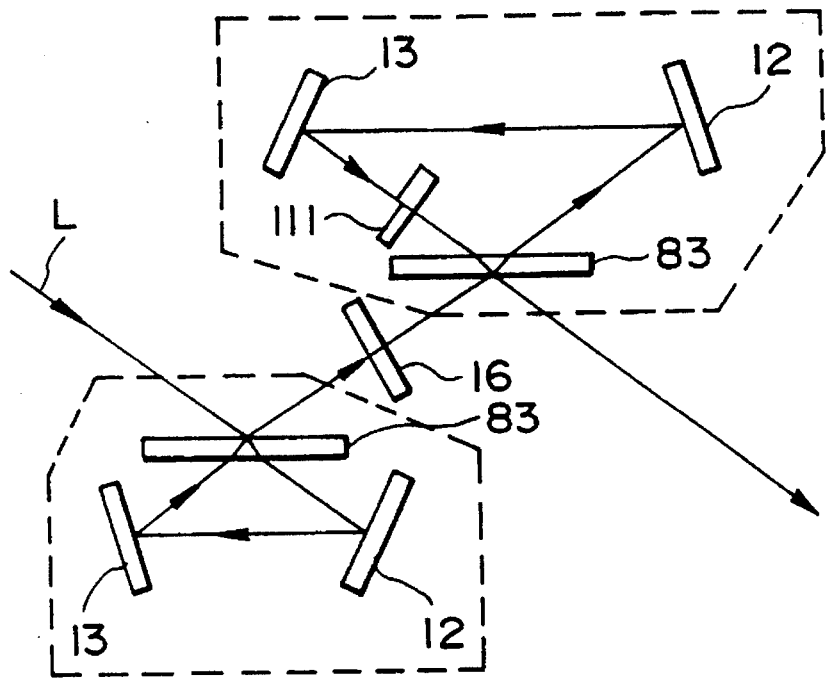
F I G. 18
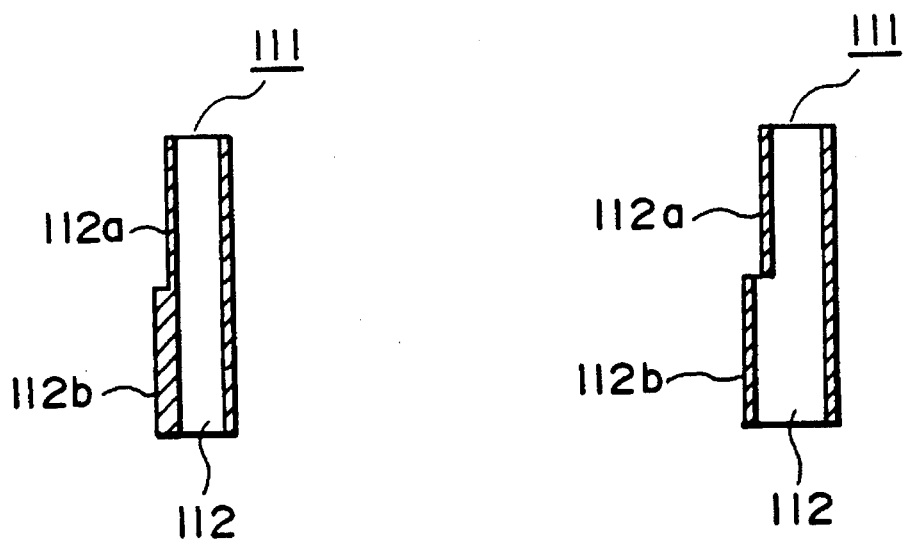
F I G. 19A   F I G. 19B

ILLUMINATION DEVICE INCLUDING AN OPTICAL INTEGRATOR DEFINING A PLURALITY OF SECONDARY LIGHT SOURCES AND RELATED METHOD

This application is a continuation of prior application Ser. No. 07/918,005 filed Jul. 24, 1992, now abandoned, which application is a divisional of prior application Ser. No. 07/534,246, filed 6/7/90 now U.S. Pat. No. 5,153,773.

FIELD OF THE INVENTION AND RELATED ART

This invention relates to an illumination device and, more particularly, to an illumination device suitably usable in an exposure apparatus for manufacture of semiconductor microcircuits, for illuminating a circuit pattern of a mask or a reticle.

Many attempts have been made to develop an exposure apparatus having a coherent light source such as an excimer laser, for example. As a problem raised when a circuit pattern of a mask or reticle is irradiated with a light beam from a coherent light source, there is non-uniformness in the illuminance distribution upon the mask or reticle. This non-uniformness attributes to an interference fringe formed by the light beam from the coherent light source. Thus, in order to avoid such non-uniformness in the illuminance distribution resulting from the interference fringe, many types of illumination devices have been attempted.

SUMMARY OF THE INVENTION

The present invention is concerned with improvements in this type of illumination device, and it is accordingly an object of the present invention to provide an illumination device by which a surface to be illuminated, such as the surface of a mask or reticle, can be illuminated in the manner best suited to the manufacture of semiconductor microcircuits, for example.

In accordance with an aspect of the present invention, to achieve the above object, there is provided an illumination device, comprising: a radiation source; an optical integrator having an array of lenses disposed along a plane perpendicular to an optical axis of said device; a first optical system for amplitude-dividing a coherent beam from said radiation source and producing plural beams which are substantially incoherent with each other, said first optical system also being effective to project the beams to said optical integrator in different directions and to superpose the beams upon one another on said optical integrator; and a second optical system for directing beams from said lenses of said optical integrator to a surface to be illuminated and for superposing the beams upon one another on the surface to be illuminated.

Also, in accordance with another aspect of the present invention, there is provided an illumination device, comprising: a radiation source for supplying a radiation beam having an asymmetrical intensity distribution; and an illumination optical system for amplitude-dividing the radiation beam into first and second beams and for superposing the first and second beams upon one another so that the first beam is inverted relative to the second beam, to thereby produce a third beam having an intensity distribution which is symmetrical with respect to an optical axis of said illumination optical system, wherein the third beam is directed to a surface to be illuminated to illuminate the same.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 4 is a chart showing forms arranged in accordance with the present invention.

FIGS. 6A–6E are graphs, respectively, showing light intensity distributions upon some sections on the path of laser light and upon a reticle surface, in the device shown in FIG. 5.

FIG. 7 is a schematic view, illustrating in sections a laser beam from a laser source and four laser beams formed by dividing the laser beam from the laser source, in the illumination device of the FIG. 5 embodiment.

FIG. 10 is a schematic view showing an example wherein a pair of beam inversion optical systems are arrayed two-dimensionally.

FIG. 11 is a schematic view showing a modified form of the optical arrangement of the FIG. 9A example.

FIG. 12 is a schematic view showing an example wherein a pair of beam inversion optical systems such as shown in FIG. 10 are coupled by a relay optical system.

FIG. 13 is a schematic view showing an example of the relay optical system in FIG. 12.

FIG. 14 is a schematic view showing another example wherein a plurality of beam inversion optical systems are used.

FIGS. 15 and 16 are schematic views, respectively, illustrating the relationship between the state of impingement of plural light beams on an optical integrator and the illuminance distribution on the surface being illuminated.

FIGS. 17A–17C are schematic views, respectively, each showing a beam inversion optical system including a phase shift plate.

FIG. 18 is a schematic view showing an example wherein a plurality of beam inversion optical systems each having a phase shift plate, are used.

FIGS. 19A and 19B are schematic views, respectively, each showing an example of a shift phase plate.

DESCRIPTION OF THE PREFERRED EMBODIMENTS

Figure 1:
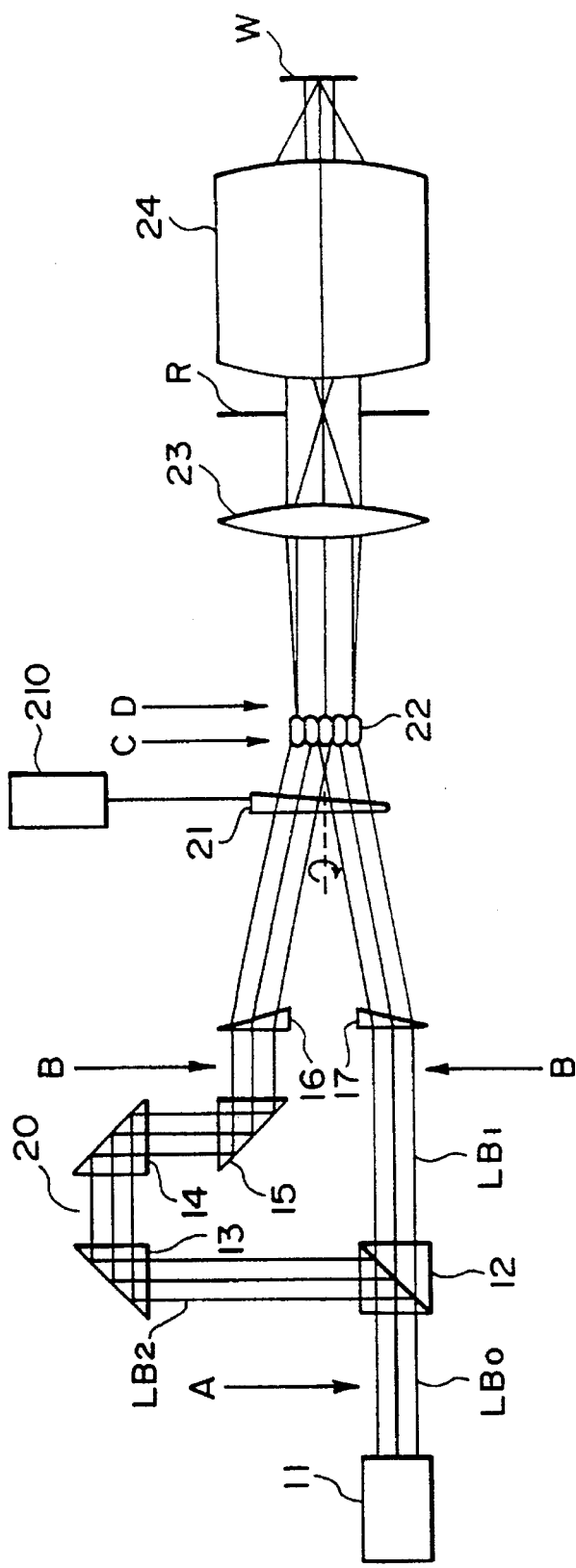
FIG. 1 is a schematic view showing a general structure of an illumination device according to an embodiment of the present invention.

FIG. 1 is a schematic view showing a general structure of an illumination device according to an embodiment of the present invention. In this embodiment, the invention is applied to a reduction projection type exposure apparatus, called a "stepper".

In FIG. 1, denoted at 11 is a KrF excimer laser having a relatively small spatial coherency (i.e. a relatively large number of transverse modes); at 20 is a light dividing and incoherence-transformation optical system; at 22 is an optical integrator having an array of bar lenses, arrayed along a plane perpendicular to the optical axis of the illumination device; at 23 is a condenser lens; at R is a reticle (or mask) having a circuit pattern formed thereon; at W is a wafer having a resist applied thereto; and at 24 is a reduction projection lens system for projecting the circuit pattern of the reticle R onto the wafer W. The optical system 20 includes a half mirror (prism) 12, mirrors (rectangular prisms) 13, 14 and 15, wedge-shaped prisms 16 and 17, and another wedge-shaped prism 21 which is rotatable when actuated by a driving means 210. The optical system 20 functions to amplitude-divide laser light from the laser 11 and to provide a plurality of mutually incoherent light beams to the optical integrator 22. While the optical system 20 has additional functions, other than this, those functions will be descried later in detail.

FIGS. 2A–2E illustrate light intensity distributions upon sections A–D (planes perpendicular to the sheet of the drawing) and upon the reticle R surface, on the path of the laser light in the device of FIG. 1. Referring to FIGS. 1 and 2A–2E, the illumination device of the present embodiment will be explained in detail.

Parallel laser light emanating from the laser 1 enters the half mirror 12, by which the laser light is amplitude-divided into two light beams LB1 and LB2. The light beam LB1 passed through the half mirror 12 goes straight toward the wedge-shaped prism 17 while, on the other hand, the light beam LB2 reflected by the half mirror 12 is further reflected by the mirrors 13, 14 and 15 in this order so that its path is bent three times, each at a right angle, and thereafter it goes to the wedge-shaped prism 16. There is a difference in length between the optical path for the light beam LB1 impinging on the wedge-shaped prism 17 and the optical path for the light beam LB2 impinging on the wedge-shaped prism 16. The optical system 20 is arranged so that the difference in optical path length between the light beams LB1 and LB2 is not shorter than the temporal coherence length of the laser light as determined by the wavelength range of the laser light (i.e. light beams LB1 and LB2). Accordingly, there occurs substantially no interference between the light beams LB1 and LB2 as deflected by the wedge-shaped prisms 16 and 17, respectively. Namely, these light beams are substantially incoherent with each other.

As described hereinbefore, the excimer laser 11 used in the present embodiment has a relatively small spatial coherency. However, for reduction of chromatic aberration to be produced by the projection lens system 24, a band narrowing element such as an etalon, prism or the like is used to narrow the wavelength range (bandwidth) of the laser light extremely. For this reason, the temporal coherency is large. Since in the present embodiment a laser light of a center wavelength $\lambda=248.4$ nm and a wavelength range $\Delta\lambda=0.003$ nm is used, the temporal coherence length of the laser beams LB1 and LB2 is relatively long. In consideration thereof, by imparting an optical path difference to the light beams LB1 and LB2, mutually incoherent light beams are produced and directed to the optical integrator 22 so as to avoid formation of an interference fringe on a light receiving surface of the optical integrator 22, or to reduce the contrast of an interference fringe, if any, on the light receiving surface of the optical integrator. This will be described later in more detail.

Each of the light beams LB1 and LB2 deflected (refracted) by the wedge-shaped prisms 16 and 17, respectively, is inputted to the wedge-shaped prism 21 in the form of parallel light. Since the wedge-shaped prism 21 is being rotated by the driving means 210 about the optical axis of an optical system comprising the condenser lens 23 and the projection lens system 24, the path of each of the light beams LB1 and LB2 passing through the wedge-shaped prism 21 and impinging on the light receiving surface of the optical integrator 22 as well as the position of incidence thereof upon this light receiving surface, change with time.

Here, the wedge-shaped prisms 16, 17 and 21 are so arranged that the light beams LB1 and LB2 always partially overlap one upon another, on the light receiving surface of the optical integrator 22.

Figures 2A, 2B, 2C, 2D, 2E:
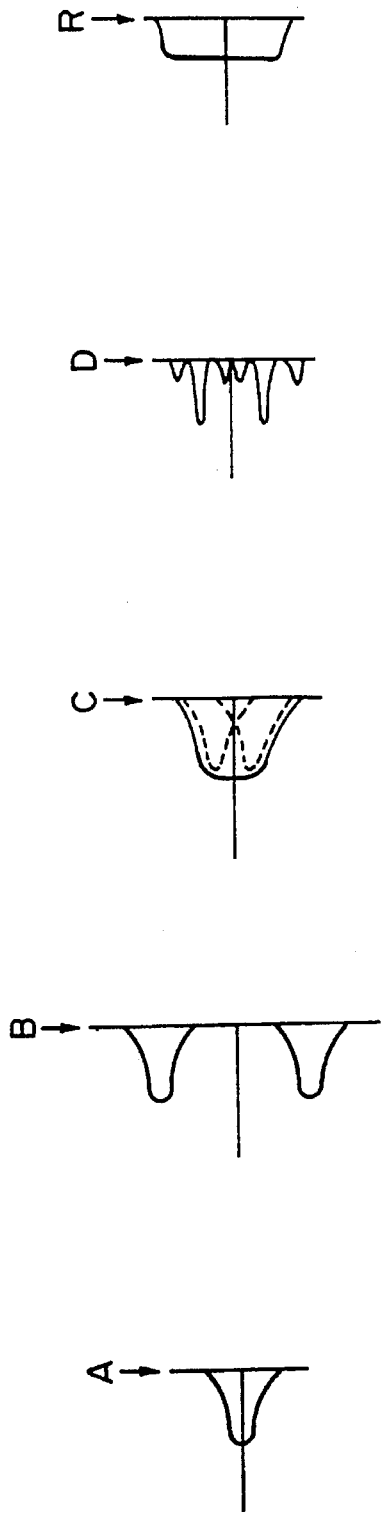
FIGS. 2A–2E are graphs, respectively, showing light intensity distributions upon sections on the laser light path and upon a reticle surface, in the device shown in FIG. 1.

As shown in FIG. 2A, the laser light from the laser 11 has a sectional intensity distribution which is in the form of or similar to a Gaussian distribution. Thus, as shown in FIG. 2B, each of the light beams LB1 and LB2 impinging on the wedge-shaped prisms 16 and 17 has a sectional intensity distribution in the form of a Gaussian distribution. When these light beams LB1 and LB2 are inputted to the light receiving surface of the optical integrator 22 and partially overlap one upon another, the combined light has a sectional intensity distribution which, as shown in FIG. 2C, is symmetrical with respect to the optical axis and, additionally, it is substantially uniform. This is the effect of partial overlapping of the light beams LB1 and LB2 on the light receiving surface of the optical integrator 22 as described. Also, in the neighborhood of the light emitting portion of the optical integrator 22, i.e., in the section D, there is produced a light intensity distribution such as shown in FIG. 2D. It is to be noted here that preferably the light beams LB1 and LB2 should be so superposed one upon another on the light receiving surface of the optical integrator 22 that, even if in the section B the light beams LB1 and LB2 have sectional intensity distributions of the form other than the Gaussian distribution, still a uniform intensity distribution is provided on the light receiving surface (plane C) of the optical integrator 22.

The uniformness in illuminance distribution upon the reticle R surface is proportional to the uniformness in light intensity distribution on the light receiving surface of the optical integrator 22 and the number of the lens elements constituting the optical integrator 22. On the other hand, when a plurality of coherent light beams such as the light beams LB1 and LB2 are inputted to an optical integrator, the larger the number of lens elements to which a single light beam is inputted, the larger is the number of mutually coherent secondary light sources formed in the neighborhood of the light emitting end of the optical integrator. Mutually coherent light beams from these secondary light sources easily interfere with each other to form an interference fringe of high contrast on the surface of a reticle. Since the optical integrator has a function for dividing the wavefront of a received light beam, the contrast of such an interference fringe is determined by the degree of spatial coherency of the laser.

In the present embodiment, as the laser 11, a laser having small spatial coherency is used and, in place of increasing the number of lens elements of the optical integrator 22, the optical arrangement is structured so that some lens elements receive both the light beams LB1 and LB2 to thereby increase the number of formed secondary light sources, to thereby avoid that an interference fringe, if any, formed on the reticle R damages the uniformness in illuminance distribution upon the reticle R. Further, since the light beams LB1 and LB2 are projected to the optical integrator 22 in different directions, interference fringes of low contrast, if any, formed by the light beams LB1 and LB2 on the reticle R surface, have different phases. This results in a smoothing affect on the light intensity distribution as determined by these interference fringes, and therefore, the formation of interference fringes does not so influence the illuminance distribution on the reticle R surface.

Further, in the present embodiment, the wedge prism 21 is rotated to thereby shift the paths for the light beams LB1 and LB2 impinging on the optical integrator 22 as well as their positions of incidence upon the optical integrator. Accordingly, the light intensity distribution to be formed on the light receiving surface of the optical integrator 22 has such a shape as formed by superposing plural light intensity distributions formed successively. This attains further enhancement of uniformness. Also, in the neighborhood of the light emitting surface of the optical integrator, the light beams LB1 and LB2 provide a distribution of secondary light sources (i.e. an effective light source) which change with time. Accordingly, the number of secondary light sources increases substantially.

Since the excimer laser 11 is a pulsed laser, it emits pulsed laser light at preset time intervals. When the number of laser pulses necessary for printing, by exposure, the circuit pattern of the reticle R onto the resist layer of the wafer W is denoted by M, if during the exposure the wedge prism 21 is rotated continuously, the light intensity distribution on the light receiving surface of the optical integrator 22 has such a shape as formed by superposing light intensity distributions of a number M, one upon another. Further, if the light beams LB1 and LB2 produce secondary light sources of a number N per one laser pulse, then the wafer W is exposed with the lights from the secondary light sources of a number "M×N".

Next, the optical arrangement following the optical integrator 22 will be explained in detail.

The condenser lens 23 comprises a lens assembly constituted by plural lens elements disposed along the optical axis, and it serves to direct, toward the reticle R, the light beams from a large number of secondary light sources as formed in the neighborhood of the light emitting surface of the optical integrator 22. The secondary light sources of a large number are distributed in a plane perpendicular to the optical axis of the condenser lens 23, and the spacing between this plane (secondary light source forming plane) and the light entrance side (front) principal plane of the condenser lens 23 is equal to the focal length of the condenser lens 23. On the other hand, the spacing between the light exit side (rear) principal plane of the condenser lens 23 and the reticle R is set to be equal to the focal length of the condenser lens 23. In this structure, each of the light beams from the secondary light sources of a large number, is transformed by the condenser lens 23 into parallel light, and the resultant parallel light beams are efficiently superposed one upon another on the reticle R surface. The illuminance distribution on the reticle R at this time is satisfactorily uniform, as illustrated in FIG. 2E.

Similarly, the projection lens system 24 comprises a lens assembly constituted by plural lens elements disposed along the optical axis, and it serves to bring the circuit pattern surface of the reticle R and the surface of the wafer W to be exposed, into an optically conjugate relationship. In the present embodiment, the structure is arranged so that the projection lens system 24 forms an image of the circuit pattern of the reticle R on the wafer W at a reducing magnification of 1:5. The projection lens system 24 has an entrance pupil (not shown) which is placed in an optically conjugate relationship with the secondary light source forming plane adjacent to the light emitting surface of the optical integrator 22. Thus, like the reticle R, the wafer W is illuminated in the manner of Kohler illumination.

The optical integrator 22 and the condenser lens 23 is arranged so as to bring the light receiving surface of the optical integrator 22 and the circuit pattern surface of the reticle R into an optically conjugate relationship.

As described in the foregoing, the illumination device of the present embodiment uses as a light source an excimer laser (11) having small spatial coherency and, through the optical system 20, mutually incoherent light beams LB1 and LB2 are inputted to the light receiving surface of the optical integrator 22 along different directions so that they are superposed partially one upon another. With this arrangement, quite a large number of secondary light sources can be formed in the neighborhood of the light emitting surface of the optical integrator 22 and, additionally, the intensity distribution on the light receiving surface of the optical integrator 22 can be made uniform. As a result, it is possible to provide an effective light source having closely distributed secondary light sources, and therefore, it is possible to illuminate the circuit pattern surface of the reticle R in the manner best suited for correct and accurate transfer of the circuit pattern of the reticle to the wafer, such that an image of the circuit pattern of the reticle R can be correctly and accurately printed on the wafer W.

The rotatable wedge prism 21 may be provided between the optical integrator 22 and the reticle R. Also, if in the optical path within the optical system 20 the diffraction loss of the light beam LB1 or LB2 is large, an imaging system such as a focal converter may be provided on the optical path so as to assure efficient transmission of the light beam LB1 or LB2 to the optical integrator 22. On that occasion, such an imaging system may be disposed so as to provide an optically conjugate relationship between the surfaces of predetermined optical elements, of the optical system 20, through which the light passes.

While in the present invention a light beam from a coherent light source such as a laser is amplitude-divided to provide a plurality of light beams, the number of such light beams is preferably about three (3) to twenty (20). By using light beams of a number within such a range, the optical system can be made relatively compact and, additionally, a satisfactory effective light source is obtainable.

Further, in the present invention, it is effective to use such a laser as having a large number of transverse modes and small spatial coherency and, particularly, good results are obtainable by using a laser (particularly an excimer laser) having a transverse mode of a number not less than one hundred (100). When an illumination device using such a laser as a light source is incorporated into a reduction projection type exposure apparatus, as in the FIG. 1 embodiment, it is possible to provide an exposure system having a good pattern transfer performance.

Figure 3A:
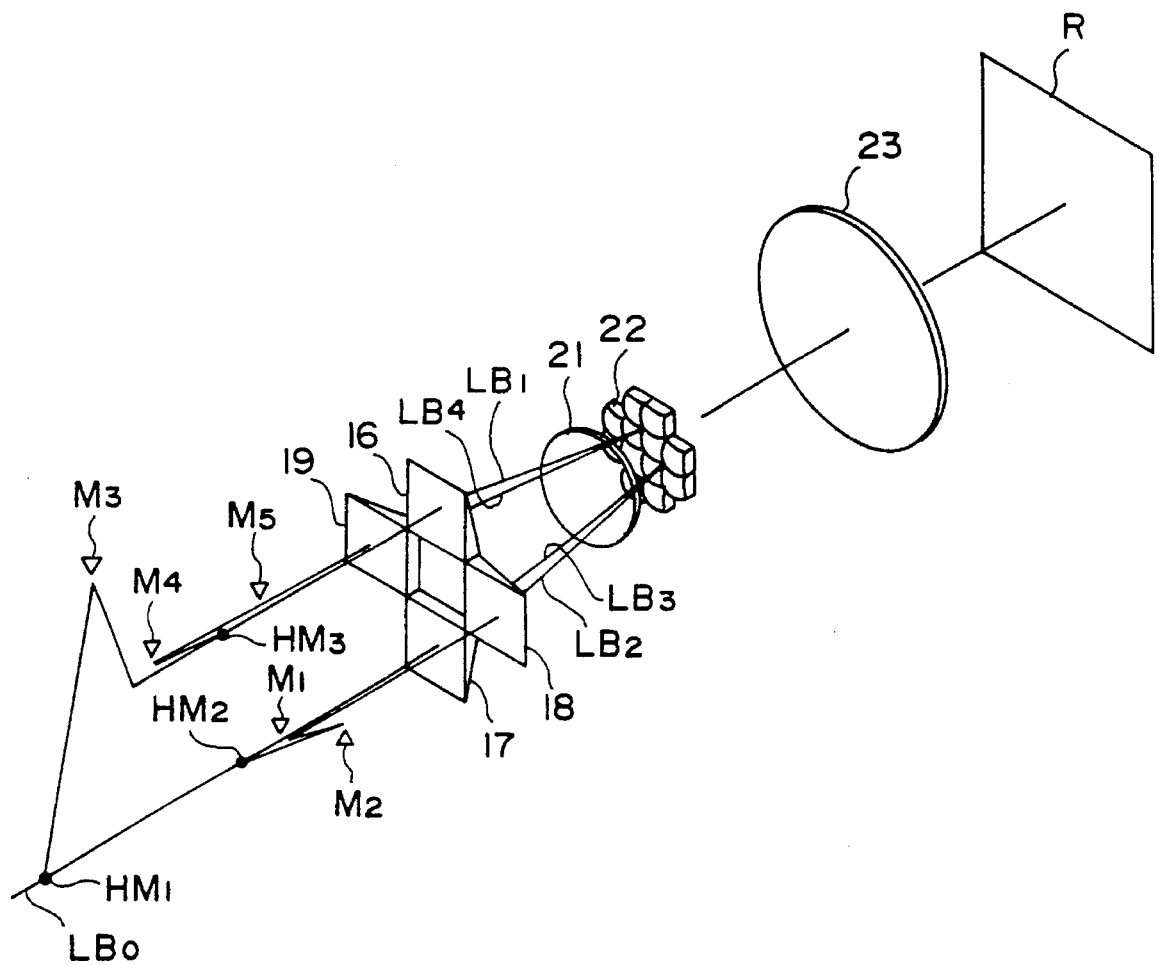
FIGS. 3A and 3B are schematic views, respectively, showing a modified form of the FIG. 1 device.
Figure 3B:
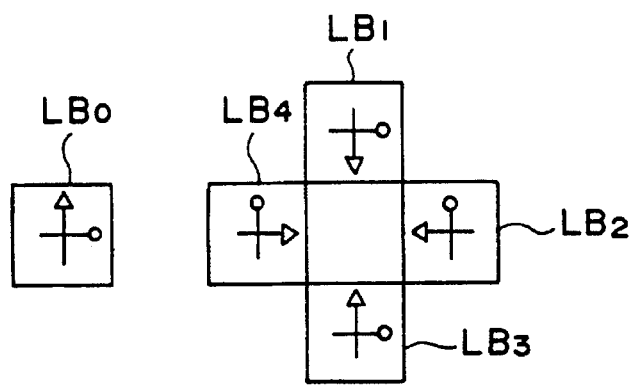

FIGS. 3A and 3B are schematic views, showing a modified form of the FIG. 1 device. In the embodiment shown in FIG. 1, for convenience in explanation, the optical system 20 is illustrated to be adapted to amplitude-divide the laser light into two (light beams LB1 and LB2). In reference to the present embodiment, however, the structure of such an optical system 20 adapted to amplitude-divide the light into four will be explained.

FIG. 3A illustrates details of a part of FIG. 1, from the optical system 20 to the reticle R. In this embodiment, the optical system 20 is constituted by half mirrors HM1 and HM2 and HM3; mirrors M1, M2, M3, M4 and M5; wedge-shaped prisms 16, 17, 18 and 19; and a rotatable wedge-shaped prism 21. Laser light LB0 emitted from a laser (not shown) has a sectional intensity distribution which is asymmetrical with respect to the optical axis of the illumination device. The laser light LB0 is amplitude-divided into four light beams, by means of a system constituted by the half mirrors (HM1, HM2 and HM3) and the mirrors (M1, M2, M3, M4 and M5), and each light beam is inputted to a corresponding one of the wedge-shaped prisms 16–19, such that light beams LB1, LB2, LB3 and LB4 emanate from these wedge-prisms 16–19, respectively. These light beams LB1–LB4 are incoherent with each other and, after passing through the wedge-prism 21, they are partially superposed one upon another on the light receiving surface of an optical integrator 22.

In the present embodiment, the optical arrangement is set so that each of the light beams LB1–LB4 is inputted to any four lens elements of the lens elements constituting the optical integrator 22 and that, on the light receiving surface of the optical integrator 22, partial overlapping is produced between the light beams LB1 and LB2; between the light beams LB1 and LB4; between the light beams LB2 and LB3; and between the light beams LB3 and LB4.

As best seen in FIG. 3B, the light beam LB3 is inverted relative to the light beam LB1 while, on the other hand, the light beam LB4 is inverted relative to the light beam LB2. Also, with respect to the horizontal direction or longitudinal direction in the sheet of the drawing, the light beams LB1–LB4 have different sectional intensity distributions. These light beams LB1–LB4 are projected to the optical integrator 22 along respective optical paths which are predetermined, so that a uniform light intensity distribution is produced on the light receiving surface of the optical integrator 22 and also that the interference fringes to be formed by these light beams are formed at different positions on the reticle R surface.

FIG. 4 is a chart illustrating examples according to the present invention, as Type 1–Type 7. In FIG. 4, row (I) corresponds to the sectional configuration of a portion of an optical integrator to which a predetermined single light beam as formed by the amplitude-division is inputted. Row (II) corresponds to the sectional configuration of the optical integrator as a whole, and row (III) corresponds to the state of superposition of the plural light beams upon the light receiving surface of the optical integrator (wherein each dot represents the beam center). Row (IV) corresponds to an effective light source (distributed secondary light sources) as formed by a single laser beam pulse in the neighborhood of the light emitting surface of the optical integrator (wherein each dot represents one secondary light source), and row (V) corresponds to the number of the secondary light sources as formed by a single laser beam pulse in the neighborhood of the light emitting surface of the optical integrator. Type 1. In this chart corresponds to the arrangement having been described with reference to FIGS. 3A and 3B.

With the embodiments of the present invention as described in the foregoing, not only can a uniform illuminance distribution be provided on a surface being illuminated, such as the surface of a reticle or wafer, but also an effective light sources having a large number of distributed secondary light source can be formed in the optical path of the illumination device. Thus, it is possible to illuminate a surface, to be illuminated, satisfactorily. Accordingly, when the illumination device is used to illuminate a reticle or a wafer, it is possible to correctly and accurately transfer the circuit pattern of the reticle onto the wafer.

Figure 5:
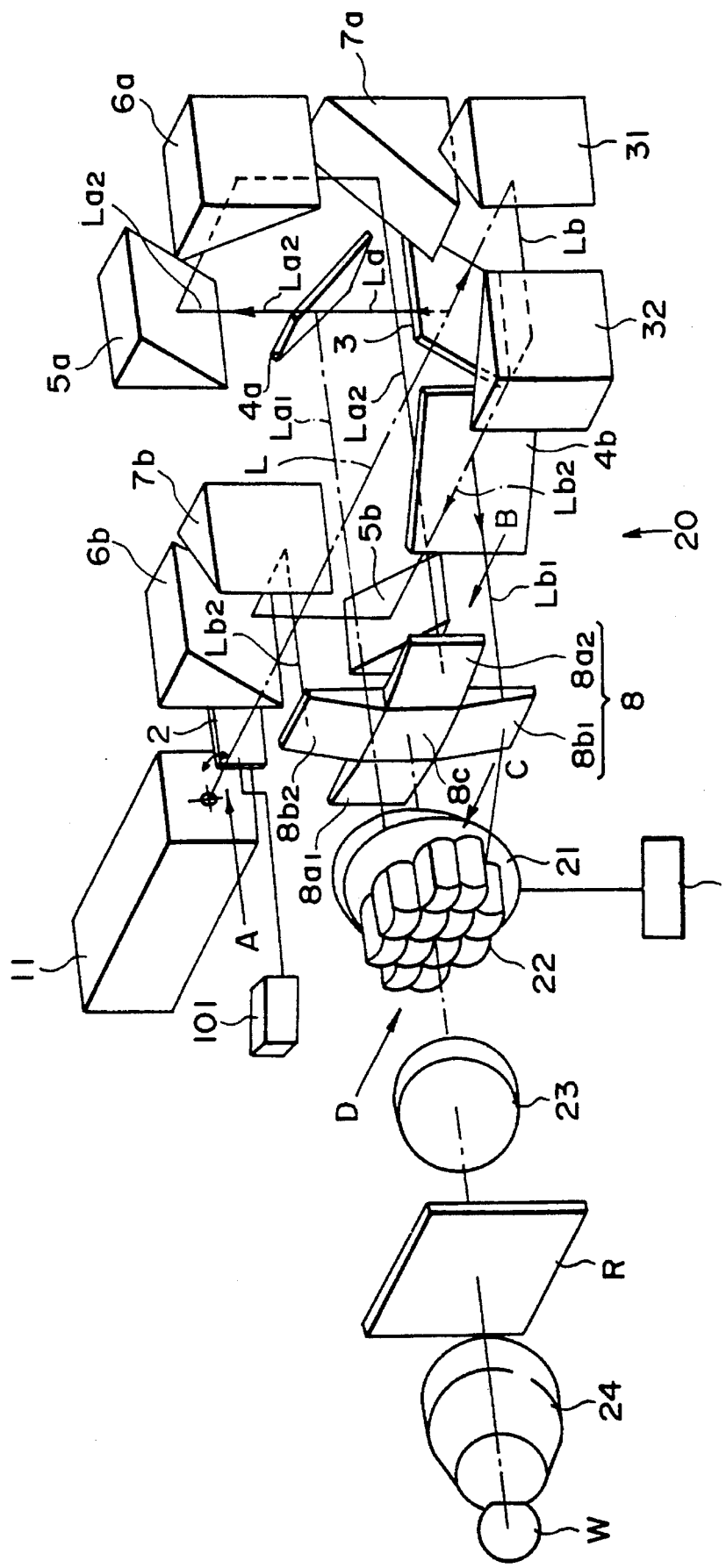
FIG. 5 is a schematic view showing a general structure of an illumination device according to another embodiment of the present invention.

FIG. 5 is a schematic view showing a general structure of an illumination device according to another embodiment of the present invention. In this embodiment, the invention is applied to a reduction projection type exposure apparatus, called a "stepper".

In FIG. 5, light source 11 comprises a KrF excimer laser having a relatively small spatial coherency (i.e., having a relatively large number of transverse modes). The light source 11 produces a coherent parallel light (laser light).

Optical member 2 comprises a transparent parallel surface plate and is disposed tiltably. It serves to shift or translate the light from the laser 11, in a direction perpendicular to the optical axis of the illumination device. First beam splitter 3 serves to amplitude-divide the laser light passing through the optical member 2, into two light beams La and Lb (reflected light and transmitted light). The light beam La reflected by the first beam splitter 3 is again amplitude-divided by a second beam splitter 4a into two light beams $La_1$ and $La_2$ (reflected light and transmitted light). Of these light beams, the reflected light beam $La_1$ is inputted to one wedge-shaped prism $8a_1$ of a first deflector 8, including four wedge-shaped prisms $8a_1$, $8a_2$, $8b_1$ and $8b_2$ and being adapted to deflect, by refraction, received plural light beams to superpose them one upon another. Denoted at 8c is a component of the first deflector 8, for mechanically coupling the four wedge-shaped prisms $8a_1$–$8b_2$.

The light beam $La_2$ transmitted through the second beam splitter 4a is reflected by reflection mirrors 5a, 6a and 7a in this order, whereby with respect to the cross-section of the light, it is rotated or inverted by 180 degrees relative to the light beam $La_1$ and then is inputted to one wedge-shaped prism $8a_2$ of the first deflector 8.

On the other hand, the light beam Lb transmitted through the first beam splitter 3 is reflected by reflection mirrors 31 and 32, in this order, and then it is amplitude-divided again by a third beam splitter 4b into two light beams $Lb_1$ and $Lb_2$ (reflected light and transmitted light).

Of these light beams, the reflected light beam $Lb_1$ is inputted to one wedge-shaped prism $8b_1$ of the first deflector 8. On the other hand, the light beam $Lb_2$ transmitted through the third beam splitter 4b is reflected by reflection mirrors 5b, 6b and 7b in this order, whereby with respect to the cross-section of the light it is rotated or inverted by 180 degrees relative to the light beam $Lb_1$, and then it is inputted to one wedge-shaped prism $8b_2$ of the first deflector 8.

The four light beams $La_1$, $La_2$, $Lb_1$ and $Lb_2$ inputted to the first deflector 8 are refracted and deflected by the corresponding wedge-shaped prisms $8a_1$, $8a_2$, $8b_1$ and $8b_2$, respectively, and then they pass through a wedge-shaped prism (second deflector) 21 and are projected on the light receiving surface of the optical integrator 22 with overlapping. The optical integrator 22 comprises a plurality of bar lenses arrayed along a plane perpendicular to the optical axis of the illumination device. Here, the four light beams $La_1$–$Lb_2$ are incoherent with each other, as will be described later. The wedge-prism 21 is arranged to be rotated about the optical axis of a condenser lens 23, through a driving means 210.

In the neighborhood of the light emitting surface of the optical integrator 22, there is formed a secondary light source forming plane. In this plane, a large number of secondary light sources are formed, wherein the number is determined by the number of the bar lenses constituting the optical integrator 22 and the number of light beams inputted to the optical integrator. Under the influence of the condenser lens 23, the light beams from the light emitting surface of the optical integrator 22 are superposed one upon another on the surface of a reticle R, whereby the reticle R is illuminated with these light beams. Projection lens system 24 serves to project, in a reduced scale, a circuit pattern of the thus illuminated reticle R onto a wafer W.

In the present embodiment, each of the first, second and third beam splitters 3, 4a and 4b is provided by a half mirror. Also, the optical elements disposed between the laser 11 and the optical integrator 22 provide a light dividing and incoherence-transformation optical system, like the first embodiment described hereinbefore.

FIGS. 6A–6E illustrate light intensity distributions upon the sectional planes A–D in FIG. 5 as well as upon the reticle R surface, on the optical path shown in FIG. 5.

Referring now to FIG. 7, if in the present embodiment a reference orientation is set in the section L of the laser light just emitted by the laser source 11, as illustrated, corresponding orientations of the light beams $La_1$, $La_2$, $Lb_1$ and $Lb_2$ impinging on the wedge-shaped prisms $8a_1$, $8a_2$, $8b_1$ and $8b_2$ are placed radially about a reference point P, as illustrated in FIG. 7, wherein the reference point P coincides with the optical axis of the condenser lens 23. Here, FIG. 7 shows the sections of the four light beams $La_1$–$Lb_2$ impinging on the first deflector 8, as viewed from the wafer W side.

As regards the four light beams $La_1$–$Lb_2$ impinging on the wedge-shaped prisms $8a_1$–$8b_2$ of the first deflector 8, they have different optical paths from the first beam splitter 3 to the first deflector 8, having different optical path lengths. The components of the optical system 20 are set so that such a difference in optical path length becomes larger than the temporal coherence length 1 as determined by the wavelength range of the laser light from the laser 11. In the present embodiment, with respect to the optical path length, the light beams $La_1$–$Lb_2$ satisfy the following relations:

$Lb_2 > La_2 > Lb_1 > La_1$ $Lb_2 - La_2 = La_2 - Lb_1 = Lb_1 - La_1 = 1$

With this arrangement, the four light beams are transformed into mutually incoherent lights, such that when they are superposed one upon another on the light receiving surface of the optical integrator 22, substantially no interference occurs among them.

It is to be noted here that, in the present embodiment, the four light beams $La_1$–$Lb_2$ inputted to the first deflector 8 have energies of substantially the same strength.

When the number of beam splitters used is "$2^i-1$" (i=2, 3, 4, ... n) and the number of light beams to be provided by the division through the optical system 20 is "$2^i$" (i=2, 3, 4, ... n), each beam splitter may have a reflection factor and a transmission factor of about 50%, respectively. If a different number of beam splitters and/or a different number of light beams are used, it may be necessary to adjust the proportion of the reflection factor and the transmission factor of each beam splitter so as to ensure that the light beams inputted to the first deflector 8 may have uniform energy strength. In this case, as a matter of course, the first deflector 8 should be provided with wedge-shaped prisms of a number corresponding to the number of the divided light beams.

The excimer laser 11 used in the present embodiment as a light source has relatively small spatial coherency. However, since in this embodiment a band-narrowing element such as an etalon, prism or the like, is used to narrow the wavelength range (bandwidth) of the laser light extremely so as to reduce chromatic aberration to be produced by the projection lens system 24, the temporal coherency of the laser is large. Particularly, in the present embodiment, light of a center wavelength $\lambda=248.4$ nm and a wavelength range $\Delta\lambda=0.003$ nm, of the laser light produced by an excimer laser is used. As a result, the coherence length of each of the light beams $La_1$, $La_2$, $Lb_1$ and $Lb_2$ is relatively long.

In consideration thereof, by imparting a predetermined optical path difference to these light beams through the optical system 20, they are transformed into mutually incoherent light beams and, as a result, when they are superposed one upon another on the light receiving surface of the optical integrator 22, substantially no interference fringe is formed by the interference of these light beams.

Further, through the driving means 102, the wedge-shaped prism 21 (second deflector) is rotated about the optical axis of an optical systems-comprising the condenser lens 23 and the projection lens system 24. By this, the optical paths for the four light beams $La_1$–$Lb_2$ passing through the second deflector 21 and impinging on the light receiving surface of the optical integrator 22 as well as their positions of incidence upon the light receiving surface of the optical integrator change with time. Particularly, the first and second deflectors (prisms 8 and 21) are arranged so as to assure that the light beams $La_1$–$Lb_2$ always partially overlap one upon another, on the light receiving surface of the optical integrator 22.

As shown in FIG. 6A, the laser light from the laser 11 has a sectional intensity distribution which is in the form of or similar to a Gaussian distribution. Therefore, the light beams $La_1$–$Lb_2$ inputted to the first deflector 8 each has a sectional intensity distribution like a Gaussian distribution, such as shown in FIG. 2B. When these light beams $La_1$–$Lb_2$ are inputted to and superposed one upon another on the light receiving surface of the optical integrator 22, the combined light provides a sectional intensity distribution which, as shown in FIG. 6C, is symmetrical with respect to the optical axis and, additionally, is substantially uniform. This is the effect of partial overlapping of the light beams $La_1$–$Lb_2$ on the light receiving surface of the optical integrator 22, as described hereinbefore. Further, in the neighborhood of the light emitting surface of the optical integrator 22 (i.e. in the sectional plane D), there is produced a light intensity distribution in such a form as shown in FIG. 6D. It is to be noted here that preferably the light beams $La_1$–$Lb_2$ are so superposed one upon another on the light receiving surface of the optical integrator that, even if in the sectional plane B each light beam has a sectional intensity distribution in a form other than the Gaussian distribution, these light beams still provide a uniform intensity distribution on the light receiving surface (plane C) of the optical integrator 22.

As described with reference to FIG. 7, the present embodiment is arranged so that the orientations of the four light beams $La_1$–$Lb_2$ in their sections are placed on the first deflector 8, radially about the reference point P. Further, in this arrangement, if the laser beam just emitted from the laser 11 (as denoted at L in FIG. 7) displaces in the direction of the arrow (upward as viewed in FIG. 7), the four light beams $La_1$–$Lb_2$ displace toward the reference point P, as seen from the orientations suggested by the arrows and small circles assigned to these light beams $La_1$–$Lb_2$, in FIG. 7. Accordingly, when the optical member 2 comprising a parallel surface plate is tilted by the driving means 101 relative to the optical axis so as to shift or translate the laser beam L, on the optical integrator 22 the four light beams $La_1$–$Lb_2$ displace toward or away from the center or reference point P to thereby change the size of the light flux, as a whole, impinging on the optical integrator 22. By changing the size in this manner, it is possible to change the size of the secondary light source surface as formed in the neighborhood of the light emitting surface of the optical integrator 22. This ensures that the G value of an illumination system (i.e. the reticle side numerical aperture (NA) of the system above the reticle, or the reticle side numerical aperture (NA) of the projection lens system) is changed without changing the non-uniformness in illuminance or without reducing the efficiency. Also, this ensures that, through the driving means 101, the G value of the illumination system is changed in different ways in accordance with the exposure conditions such as the type of resist applied to the wafer, the linewidth of the circuit pattern of the reticle R and the like, such that the exposure can be performed under optimum conditions.

Further, because of the inward orientation of the arrows of the four light beams $La_1$–$Lb_2$ as illustrated in FIG. 7, when these light beams are superposed the beam profile can be flattened, and therefore, reduction of non-uniformness in illuminance is ensured effectively.

The uniformness in illuminance distribution upon the reticle R surface is proportional to the uniformness in light intensity distribution on the light receiving surface of the optical integrator 22 and the number of the lens elements constituting the optical integrator 22. On the other hand, when a plurality of coherent light beams such as the light beams $La_1$, $La_2$, $Lb_1$ and $Lb_2$ are inputted to an optical integrator, the larger the number of lens elements to which a single light beam is inputted, the larger is the number of mutually coherent secondary light sources formed in the neighborhood of the light emitting end of the optical integrator. Mutually coherent light beams from these secondary light sources easily interfere with each other to form an interference fringe of high contrast on the surface of a reticle. Since the optical integrator has a function for dividing the wavefront of a received light beam, the contrast of such an interference fringe is determined by the degree of spatial coherency of the laser.

In the present embodiment, as the laser 11, a laser having small spatial coherency is used and, in place of increasing the number of lens elements of the optical integrator 22, the optical arrangement is structured so that some lens elements receive all the light beams $La_1$, $La_2$, $Lb_1$ and $Lb_2$ to thereby increase the number of formed secondary light sources, to thereby avoid that an interference fringe, if any, formed on the reticle R damages the uniformness in illuminance distribution upon the reticle R. Further, since the light beams $La_1$, $La_2$, $Lb_1$ and $Lb_2$ are projected to the optical integrator 22 in different directions, interference fringes of low contrast, if any, formed by the light beams $La_1$–$Lb_2$ on the reticle R surface, have different phases. This results in a smoothing affect on the light intensity distribution as determined by these interference fringes, and therefore, the formation of interference fringes does not so influence the illuminance distribution on the reticle R surface.

Further, in the present embodiment, the wedge prism 21 is rotated to thereby shift the paths for the light beams $La_1$–$Lb_2$ impinging on the optical integrator 22 as well as their positions of incidence upon the optical integrator. Accordingly, the light intensity distribution to be formed on the light receiving surface of the optical integrator 22 has such a shape as formed by superposing plural light intensity distributions formed successively. This attains further enhancement of uniformness. Also, in the neighborhood of the light emitting surface of the optical integrator, the light beams LB1 and LB2 provide a distribution of secondary light sources (i.e. an effective light source) which changes with time. Accordingly, the number of secondary light sources increases substantially.

Since the excimer laser 11 is a pulsed laser, it emits pulsed laser light at preset time intervals. Where the number of laser pulses necessary for printing, by exposure, the circuit pattern of the reticle R onto the resist layer of the wafer W is denoted by M, if during the exposure the wedge prism 21 is rotated continuously, the light intensity distribution on the light receiving surface of the optical integrator 22 has such a shape as formed by superposing light intensity distributions of a number M, one upon another. Further, if the light beams $La_1$–$Lb_2$ produce secondary light sources of a number N per one laser pulse, then the wafer W is exposed with the lights from the secondary light sources of a number "M×N".

Next, the optical arrangement following the optical integrator 22 will be explained in detail.

The condenser lens 23 comprises a lens assembly constituted by plural lens elements disposed along the optical axis, and it serves to direct, toward the reticle R, the light beams from a large number of secondary light sources as formed in the neighborhood of the light emitting surface of the optical integrator 22. The secondary light sources of a large number are distributed in a plane perpendicular to the optical axis of the condenser lens 23, and the spacing between this plane (secondary light source forming plane) and the light entrance side (front) principal plane of the condenser lens 23 is equal to the focal length of the condenser lens 23. On the other hand, the spacing between the light exit side (rear) principal plane of the condenser lens 23 and the reticle R is set to be equal to the focal length of the condenser lens 23. In this structure, each of the light beams from the secondary light sources of a large number, is transformed by the condenser lens 23 into parallel light, and the resultant parallel light beams are efficiently superposed one upon another on the reticle R surface. The illuminance distribution on the reticle R at this time is satisfactorily uniform, as illustrated in FIG. 6E.

Similarly, the projection lens system 24 comprises a lens assembly constituted by plural lens elements disposed along the optical axis, and it serves to bring the circuit pattern surface of the reticle R and the surface of the wafer W to be exposed, into an optically conjugate relationship. In the present embodiment, the structure is arranged so that the projection lens system 24 forms an image of the circuit pattern of the reticle R on the wafer W at a reducing magnification of 1:5. The projection lens system 24 has an entrance pupil (not shown) which is placed in an optically conjugate relationship with the secondary light source forming plane adjacent to the light emitting surface of the optical integrator 22. Thus, like the reticle R, the wafer W is illuminated in the manner of Kohler illumination.

The optical integrator 22 and the condenser lens 23 is arranged so as to bring the light receiving surface of the optical integrator 22 and the circuit pattern surface of the reticle R into an optically conjugate relationship.

As described in the foregoing, the illumination device of the present embodiment uses as a light source an excimer laser (11) having small spatial coherency and, through the optical system 20, mutually incoherent light beams $La_1$–$Lb_2$ are inputted to the light receiving surface of the optical integrator 22 along different directions so that they are superposed partially one upon another. With this arrangement, quite a large number of secondary light sources can be formed in the neighborhood of the light emitting surface of the optical integrator 22 and, additionally, the intensity distribution on the light receiving surface of the optical integrator 22 can be made uniform. As a result, it is possible to provide an effective light source having closely distributed secondary light sources, and therefore, it is possible to illuminate the circuit pattern surface of the reticle R in the manner best suited for correct and accurate transfer of the circuit pattern of the reticle to the wafer, such that an image of the circuit pattern of the reticle R can be correctly and accurately printed on the wafer W.

The rotatable wedge prism 21 may be provided between the optical integrator 22 and the reticle R. Also, if in the optical path within the optical system 20 the diffraction loss of the light beams $La_1$–$Lb_2$ is large, an imaging system such as a focal converter may be provided on the optical path so as to assure efficient transmission of the light beams $La_1$–$Lb_2$ to the optical integrator 22. On that occasion, such an imaging system may be disposed so as to provide an optically conjugate relationship between the surfaces of predetermined optical elements, of the optical system 20, through which the light passes.

While in the present invention a light beam from a coherent light source such as a laser is amplitude-divided to provide a plurality of light beams, the number of such light beams is preferably about three (3) to twenty (20). By using light beams of a number within such a range, the optical system can be made relatively compact and, additionally, a satisfactory effective light source is obtainable.

Further, in the present invention, it is effective to use such a laser as having a large number of transverse modes and small spatial coherency and, particularly, good results are obtainable by using a laser (particularly an excimer laser) having a transverse mode of a number not less than one hundred (100). When an illumination device using such a laser as a light source is incorporated into a reduction projection type exposure apparatus, as in the FIG. 5 embodiment, it is possible to provide an exposure system having good pattern transfer performance.

While in the present embodiment the first deflector 8 comprises transmission type wedge-shaped prisms, it may be provided by a plurality of mirrors disposed to be associated with corresponding light beams. On such an occasion, a driving means operable to controllably drive these mirrors independently of each other may be used, such that the first deflector may have a function of a scanner.

In accordance with some embodiments described hereinbefore, it is possible to provide an illumination device having advantageous features such as follows:

(a) Not only is a uniform illuminance distribution provided on a surface, to be illuminated, such as the surface of a reticle or wafer, but also an effective light source comprising a large number of distributed secondary light sources can be formed in the optical path of the illumination device. Accordingly, the surface to be illuminated can be illuminated satisfactorily. As a result, when the illumination device of the present invention is used to illuminate a reticle and a wafer, it is possible to transfer the circuit pattern of the reticle onto the wafer correctly and accurately.

(b) By inverting the light beams with respect to their sections and by superposing them one upon another, even if the light from a light source has an asymmetrical intensity distribution, it is possible to form a light flux having an intensity distribution symmetrical with respect to the optical axis and to reduce the non-uniformness in illuminance on the surface to be illuminated.

(c) By placing plural divided light beams so that their orientations in their sections are set radially toward a center (optical axis), only a displacement of the light from the light source in a predetermined direction can change the σ value of the illumination system.

Figure 8:
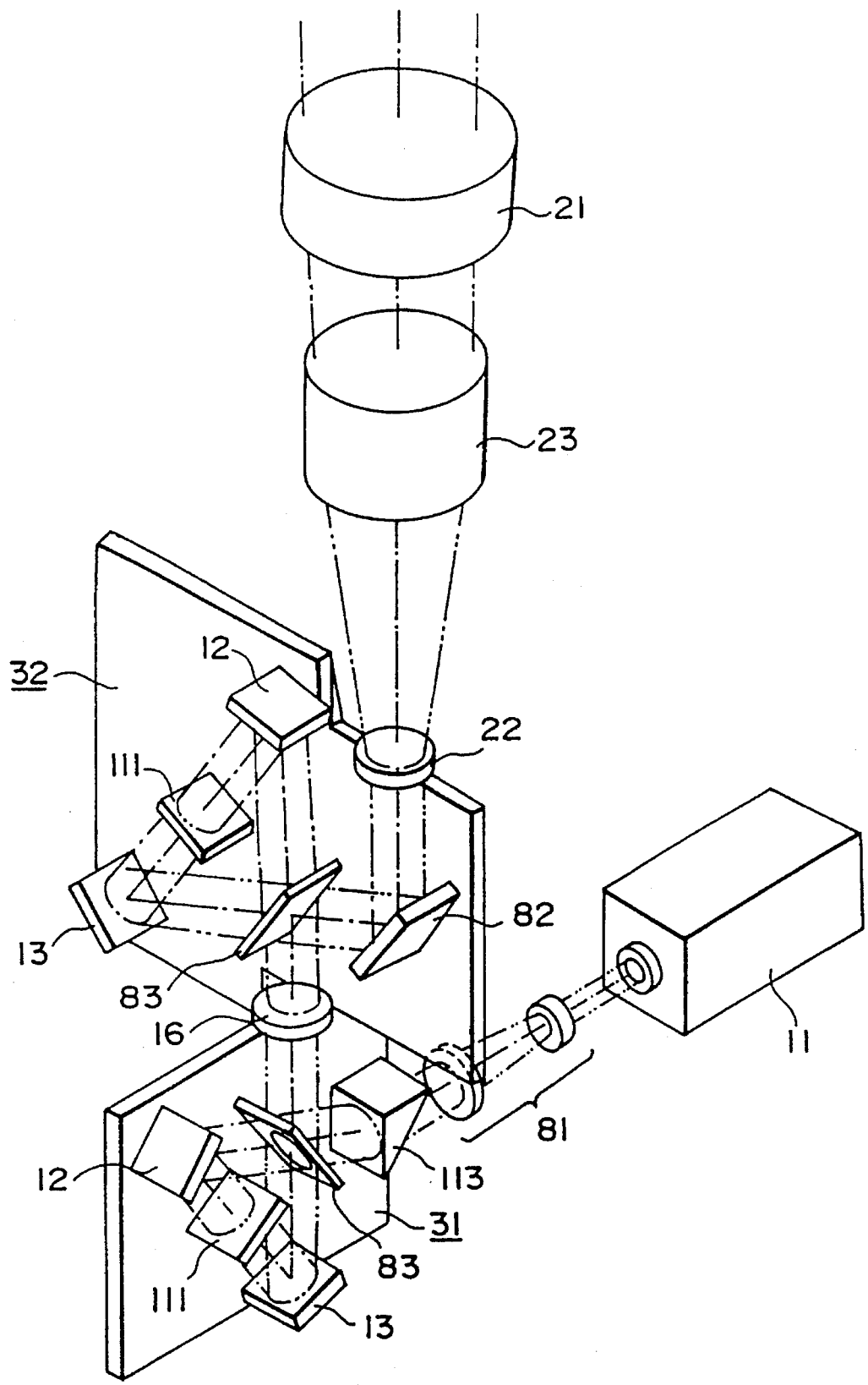
FIG. 8 is a schematic view showing a general structure of an illumination device according to a further embodiment of the present invention.

FIG. 8 is a schematic view showing a general structure of an illumination device according to a further embodiment of the present invention. The device of the present embodiment is applicable to a semiconductor device manufacturing exposure apparatus such as shown in FIG. 1, but clearly it is also applicable to other types of systems.

In the present embodiment, a laser beam emitted by a KrF excimer laser 11 and having an asymmetrical sectional intensity distribution is inputted to a beam expanding optical system 81 by which the diameter of the laser beam is expanded. Then, the laser beam passes through a prism 113 and enters a first beam reversing system 31 which comprises a parallel flat plate 83, a mirror 12, a phase shift plate 111 and another mirror 13, which mirror has a beam inverting function. Thereafter, it goes through a quarter waveplate 16 and then enters a second beam reversing system 32 of a similar structure as the first beam reversing system 31. Then, the laser beam is reflected by a mirror 82 and is inputted to an optical integrator 22. Laser beams from lens elements of the optical integrator 22 are collected by a condenser lens 23 and inputted to a scanner comprising a rotatable wedge-shaped prism 21. The light from the prism 21 is directed to a surface to be illuminated, such as, for example, the surface of a reticle (not shown), whereby the reticle surface is illuminated with uniform illuminance.

Features of the components of the illumination device according to the present embodiment will be explained below.

Figure 9A:
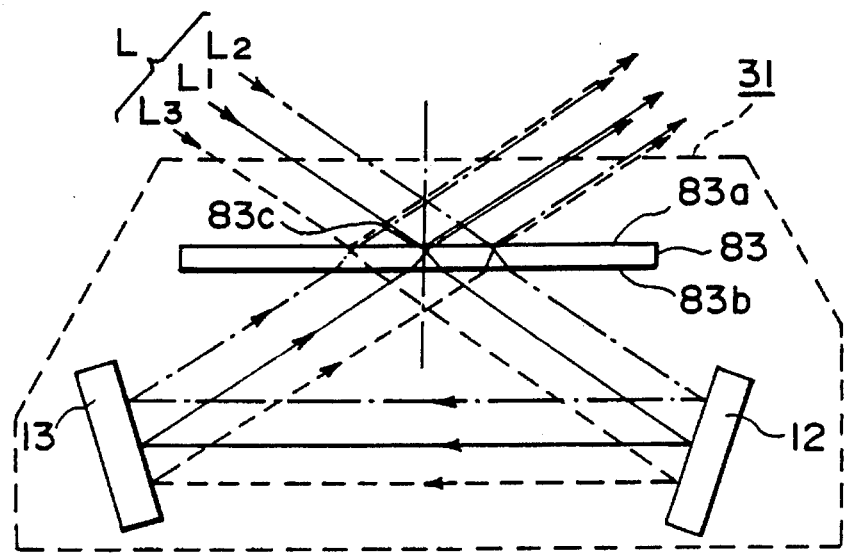
FIGS. 9A–9C are schematic views, respectively, showing examples of a beam inversion optical system.

FIG. 9A illustrates the function of the first beam reversing system shown in FIG. 8. Since the phase shift plate 111 as illustrated in FIG. 8 may be used as desired, it may be omitted and is not illustrated in FIG. 9A and in FIGS. 9B and 9C.

Generally, a laser beam has certain polarization characteristics. For this reason, by passing a laser beam from a laser source through an optical member such as a phase plate, a Fresnel rhombus or the like, it is possible to transform the laser beam into one having a random or a specific direction of polarization as can be represented by circularly polarized light.

In the embodiment shown in FIG. 9A, the laser beam L is inputted to a parallel flat plate 83 at a predetermined angle. In the FIG. 9 embodiment, the parallel flat plate 83 has its surface 83a covered by a multi-layered film, such that, when the laser beam L is inputted thereto at a predetermined angle, it serves to provide a reflection light of an S-polarized laser beam and a transmission light of a P-polarized laser beam. Namely, the parallel flat plate 83 functions as a polarization beam splitter. The P-polarized laser beam transmitted through the surface 83a goes through the backside surface 83b of the parallel flat plate 83, covered by an anti-reflection film, substantially without a loss of light quantity. Subsequently, the thus transmitted laser beam reflected by two mirrors 12 and 13 in this order, whereby it is returns to the backside surface 83b of the parallel flat plate 83, to ensure that the center of the returning laser beam coincides, at a position 83c, with the center of the S-polarized laser beam produced by the reflection of the supplied laser beam L by the parallel flat plate 83 and also that the returning laser beam is propagated in the same direction as the S-polarized laser beam. Since the returning laser beam is still a P-polarized laser beam as it passes through the parallel flat plate 83, due to the effect of the anti-reflection film, there is substantially no loss of light quantity attributable to the surface reflection. Accordingly, there is only a small loss of light quantity in the P-polarized laser light, caused by the two mirrors 12 and 13.

Figure 9B:
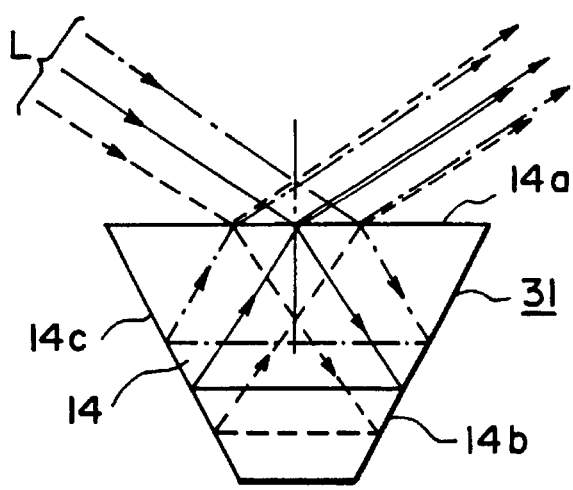
Figure 9C:
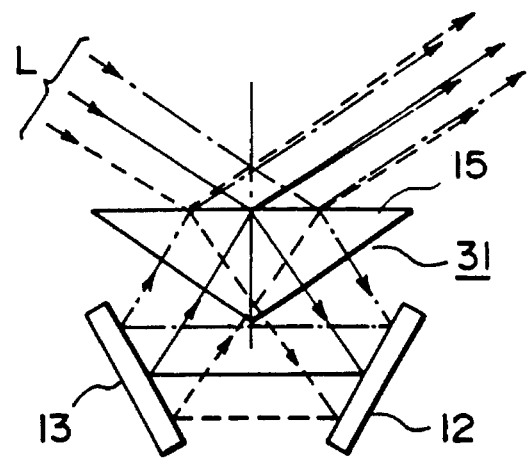

In the beam reversing system 31 shown in FIGS. 9A through 9C the angle of incidence of the laser beam to each of the optical members 83, 12 and 13 is fixed and, additionally, these optical members can be prepared only in relation to a single wavelength. Accordingly, by using a multi-layered film, it is possible to reduce the loss of light quantity to an order which can be disregarded without inconveniences. As a result, in the present embodiment, it is possible to divide a laser beam inputted to the reversing system 31 into two laser beams having different polarization components and then to re-combine the divided laser beams and direct those beams toward the second beam reversing system 32, substantially without loss of light quantity.

In the present embodiment, particular note should be paid to three features such as follows:

(I) Two laser beams of different polarization components have directions of polarization which are perpendicular to each other.

(II) It is easy to provide an optical path difference, between the two laser beams of the two polarization components, of a length not less than the coherence length of the laser light.

(III) By the inversion through the mirror, the S-polarized laser beam and the P-polarized laser beam have mutually inverted light intensity distributions.

Of these features, features (I) and (II) are contributable to the prevention of interference between the laser beam of the two polarization components.

The orthogonal relationship of the directions of polarization, in feature (I), is important not only in alleviating the interference condition, but also in assuring the matching with a following optical system. Also, it is preferable to adjust the optical arrangement in preparation, in accordance with the state of polarization of the laser beam to be inputted to the reversing system, in order to ensure that the ratio in intensity of the two polarized laser beams emanating from the reversing system 31 is maintained at 1:1.

The optical path difference of the laser beams in feature (II) is an important condition necessary for preventing the interference. Where the half width of the emission spectrum of the laser 11 is denoted by $\Delta\lambda$ and the center wavelength is denoted by $\lambda_0$, the coherence length can be expressed by "$\lambda_0^2/\Delta\lambda$". Also, in an aspect of avoiding weak high order interference terms to be produced in dependence upon the period of laser cavity length as of a He-Ne laser or the like, the combination with feature (I) is effective.

Feature (III) is for the shaping of the intensity distribution of the laser light. This is represented in FIG. 9A by the exchange between the laser beam L2 depicted by a dash-and-dot line and the laser light L3 depicted by a chain line. By passing the laser beams through the optical components illustrated in the drawing, the P-polarized laser beam is inverted relative to the S-polarized laser beam and, by this, the degree of symmetry in the sectional intensity distribution of the laser light L in the sheet of the drawing is enhanced.

FIGS. 9B and 9C are schematic views, respectively, each showing a major portion of another example of the beam reversing system 31.

In the beam reversing system 31 of the FIG. 9B example, the components of the beam reversing system of the FIG. 9A embodiment are replaced by a single prism block 14. When the prism block 14 is arranged so that the laser beam is internally reflected by the prism block by an even number of times, an S-polarized laser beam directly reflected by the surface 14a of the prism block 14 and a P-polarized laser beam as reflected by the inside reflection surfaces 14b and 14c of the prism block 14 can be superposed upon another in the manner compensating the asymmetric intensity distribution of the input laser beam L.

FIG. 9C shows an example of a beam reversing system 31 which is of a combined form of the FIG. 9A example and the FIG. 9B example.

Generally, when the direction of polarization of a laser beam inputted to a polarization beam splitting surface is isotropic (random), the laser beam may be inputted directly. When a rectilinearly polarized laser beam is used, a quarter waveplate may be inserted into the optical path so as to provide isotropic polarization. Alternatively, the direction of polarization of the laser beam to be inputted may be set at an angle of 45 degrees with respect to the polarization beam splitting surface, so as to assure that S-polarized light and P-polarized light have an intensity ratio of 1:1. By doing so, in the examples of FIGS. 9A–9C, it is possible to assure that two laser beams of different polarization components emanating from the beam reversing system 31 have an intensity ratio of 1:1.

In the beam reversing systems 31 of the examples shown in FIGS. 9A–9C, by the inversion, the degree of symmetry of the intensity distribution of the laser beam only with respect to one direction is improved. In order to enhance the degree of symmetry of the laser beam as a whole, it may be necessary to improve the degree of symmetry with respect to another direction.

FIG. 10 is a schematic view of an embodiment wherein the beam reversing system 31 (first beam reversing system) of the FIG. 9A example is combined with a similar beam reversing system 32 (second beam reversing system), the second beam reversing system being coupled in a direction perpendicular to the first beam reversing system 31.

In the FIG. 10 example, the first and second beam reversing systems 31 and 32 are effective to attain inversion in two orthogonal directions, by which the degree of symmetry of the intensity distribution of the laser beam as a whole can be improved.

When the optical path difference of the two laser beams produced by the first beam reversing system 31 is denoted by OPD1 and the optical path difference of the two laser beams produced by the second beam reversing system 32 is denoted by OPD2, the light flux emanating from the second beam reversing system 32 contains four, first to fourth light beams. Assuming now that the first light beam is such a beam having been reflected by the parallel flat plate 83 in each of the first and second beam reversing systems 31 and 32, the second light beam is such a beam having been transmitted through the parallel flat plate of the first reversing system 31 and having been reflected by the parallel flat plate of the second reversing system 32, wherein an optical path difference OPD1 is imparted to the second light beam, relative to the first light beam. Also, the third light beam is such a beam having been reflected by the parallel flat plate of the first reversing system 31 and having been transmitted through the parallel flat plate of the second reversing system 32, wherein an optical path difference OPD2 is imparted to the third light beam, relative to the first light beam. The fourth light beam is such a beam having been transmitted through the parallel flat plates of the first and second beam reversing systems, wherein an optical path difference of an amount "OPD1+OPD2" is imparted to the fourth light beams, relative to the first light beam.

In order to avoid interference of these light beams, in the present embodiment, the optical path differences OPD1 and OPD2 are set to have a difference (length) which is greater than the coherence length of the laser light. In this particular example, the following relation is satisfied:

$$OPD2=OPD1\times 2$$

If it is desired to use two beam reversing systems such as at 31 in FIGS. 9A, 9B or 9C so as to attain inversion the optical path in two orthogonal directions, particular attention should be paid to the direction of polarization. If the two reversing systems such as at 31 in FIGS. 9A–9C are directly coupled with each other, then the P-polarized light from the first beam reversing system 31 is transformed into an S-polarized light by the second beam reversing system 32, whereas the S-polarized light from the first beam reversing system 31 is transformed into a P-polarized light by the second beam reversing system 32. Accordingly, there are produced only two light beams, i.e., the first and fourth light beams in the case of the embodiment described hereinbefore. To avoid this, it is necessary to provide a quarter waveplate or some element equivalent to the quarter waveplate such as a Fresnel rhombus, for example, between the first and second beam reversing systems 31 and 32, so as to rotate the direction of polarization of the linear polarization components by 45 degrees. In the arrangement of FIG. 10, a quarter waveplate 16 is inserted.

Another example that uses the beam reversing system 31 of FIGS. 9A–9C is such that, without using a special polarization element such as a quarter waveplate or a half waveplate, the laser beam emanating from the first beam reversing system is inputted to another beam reversing system wherein the beam is reversed successively in a direction at an angle 45 degrees with respect to the reversing direction by the first reversing system. In this example, since the direction of polarization of the P-component and the S-component of the two light beams amplitude-divided by the first beam reversing system have an angle of 45 degrees with respect to a polarization beam splitting surface of the parallel flat plate of the second reversing system, the P-polarization component and the S-polarization component of the laser beams inputted to the parallel flat plate of the second reversing system are again split into P-polarized light and S-polarized light at an intensity ratio of 1:1. Of course, similar effects are attainable by inserting a quarter waveplate or a half waveplate.

By inverting the optical path successively four times, each by an angle of 45 degrees, the laser light is finally divided into coherent light beams of a number $2^4=16$, which are incoherent with each other. Additionally, a beam profile having an excellent symmetry is totally obtained. As a matter of course, it is preferable that any pair of the sixteen (16) light beams have a mutual optical path difference greater than the coherence length. This can be easily accomplished by satisfying the following relation:

$$OPDn=OPD1\times 2^{n-1}$$

where the optical path difference of the two light beams formed by the n-th beam reversing system is denoted by OPDn. However, it is to be noted that, if the optical path difference OPDn becomes so large, a smaller value may be selected from the relationship with the optical path difference OPD1 and the coherence length.

The beam splitting and combining method based on amplitude division of laser light, using a polarization beam splitting surface or the like, is basically a beam symmetrizing and shaping method with the least loss of light quantity. There does not occur a loss of light quantity at an edge portion, which otherwise might be caused by a conventional wavefront dividing method and the like. The loss of light quantity occurs only by a film formed on a mirror or a beam splitter. Also, since the total coherency of the laser light itself is made small, the formation of speckle is reduced sufficiently.

The foregoing is the basic principle of symmetrization of a sectional intensity distribution of a laser beam and incoherence transformation of a laser beam, in the present embodiment. When the present invention is applied to an exposure apparatus in which a laser such as an excimer laser, for example, is used as a light source, this is a case wherein slight modification of the structure of the beam reversing system provides better results.

As an example, as illustrated in FIG. 11, the beam reversing system 31 of FIGS. 9A–9C may be modified so that two laser beams 51 and 52 emanating from the parallel flat plate 83 have their emission angles slightly different from each other. When the two laser beams 51 and 52 have different emission angles, as in this example, gradually the laser beams separate from each other as they are propagated. As a result, if plural reversing systems are used in combination, a large deviation is produced between these light beams. On such an occasion, as illustrated in FIG. 12, preferably the beam reversing systems 31 and 32 may be coupled with the intervention of a relay system such as at 25 in FIG. 12.

When, in the reversing system 31 of FIG. 11, the point of intersection of the central ray of the two beams 51 and 52 with the surface 11a of the parallel flat plate 11 is denoted by 17a and a similar point of intersection in the next reversing system is denoted by 17b, then it is preferable that the relay system 25 has a structure such as shown in FIG. 13. Since the points 17a and 17b are in an optically conjugate relationship, one role of the relay system 25 is to ensure the imaging relation as depicted by chain lines.

On the other hand, since the laser light propagated through each reversing system comprises parallel light, actually it is once focused as depicted by solid lines and, thereafter, it is transformed back into parallel light. The problem to be considered here is the presence of the convergent point 18. When an excimer laser is used as a light source, since the excimer laser produces a laser beam of very high intensity, if the excimer laser beam is converged in air, at such a convergent point there occurs a concentration of electric field which may result in dielectric breakdown of the air and thus in production of a spark in the air. In consideration thereof, in the relay system 25 of the FIG. 13 example, a vacuum chamber 21 is provided on the optical path between relay lenses 19a and 19b so that the convergent point 18 is placed in the chamber 21. Thus, through windows 20 of the vacuum chamber 21, the laser light is directed to the next reversing system. Since in this arrangement the convergent point of the laser beam is kept in a vacuum, the device can be free from a non-linear absorption phenomenon.

FIG. 13 shows a basic structure of the relay system 25 and, when such a relay system is incorporated into a device having two reversing systems 31a (FIG. 11) disposed with relative rotation by an angle of 90 degrees, a quarter waveplate may be placed in a portion of the optical path of the relay system 25.

In the present embodiment, the beam profile of the laser light is improved and, additionally, the coherency of the laser light is reduced, in the manner as described hereinbefore and, finally, the thus obtained laser light is inputted to an optical integrator 22 such as shown in FIG. 8.

If, on this occasion, the beam reversing system used produces a difference in the angle of emission between the two divided laser beams, as shown in FIG. 11, a relay system may be provided so as to assure that the center of the optical integrator 22 as a whole coincides with a position which is optically conjugate with the point 17a. If the reversing system used does not produce a difference in the angle of emission between the two divided laser beams, the structure is set to assure that the center of the light beam coincides with the center of the optical integrator 22 as a whole.

Another important feature of the present embodiment resides in the reduction of the interference fringe which is inevitably produced by an optical integrator. While the interference fringe can be reduced in some ways, one method is to superpose different interference fringes upon one another to reduce or cancel these interference fringes totally, by using an averaging effect. The embodiment having been described with reference to FIG. 5 and using a scanner, is based on this method and is arranged to execute such a superposition of interference fringes with respect to time. From a practical standpoint, it is desirable to add the removal of temporal coherency to this. Although removal of temporal coherency is provided by using the reversing optical system, as a result of passage through the optical integrator 22 each laser beam produces on the reticle surface an interference fringe as determined by the pitch of arrayed lens elements constituting the optical integrator 22.

In the foregoing description, the reversing system is arranged to superpose two laser beams one upon another. With regard to those paired laser beams, except for the point that an optical path difference is provided by the division, they are common in that they pass through the same optical element. For this reason, the interference fringes as formed by these two laser beams on the reticle surface are analogous. Thus, relative shifting of the phases of the two interference fringes formed on the reticle by the two light beams, by a half pitch, so that the two light beams are superposed one upon another in a manner compensative with each other, is very advantageous with respect to the uniformness of illuminance distribution. As described hereinbefore, the two laser beams superposed one upon another are incoherent with each other in duplicate condition, i.e., in the point that there is an optical path difference and in the point that their polarization directions are orthogonal to each other. Accordingly, the two interference fringes are superposed one upon another in incoherent relationship.

If the intensity distribution of a laser beam outputted from a laser has a profile of a low degree of symmetry, as shown in FIG. 14 the reversing system 31 of FIGS. 9A through 9C may be used in duplication such that, after symmetrization of the beam profile, the beam may be inverted for the incoherence transformation. To this end, the reversing system of FIG. 9A or the reversing system of FIG. 11 may be used. Alternatively, both types may be used in combination. The phase of the interference fringe can be shifted in some ways. A first method is that plural laser beams are inputted to an optical integrator with inclination and in different directions, so that the interference fringes by these laser beams are superposed one upon another with mutual positional deviation whereby the interference fringes are cancelled totally. FIG. 15 is a schematic view for explaining the manner of removal of interference fringes, based on inclined light input according to the first method. For convenience in explanation, FIG. 15 illustrates a case wherein two light beams are inputted in two different directions to small lenses 22a and 22b of an optical integrator 22. The illumination system in this illustrated example has a simple structure, and light beams emanating from the lenses 22a and 22b pass through a condenser lens 23 and illuminate the surface of a reticle R. The interference fringe as formed on the reticle R surface by a first light beam from the lens 22a is depicted by a solid line 6a, while the interference fringe as formed by a second light beam from the lens 22b is depicted by a broken line 6b. As illustrated, these interference fringes 6a and 6b are mutually compensative, with the peaks and troughs of one of the solid line 6a and the broken line 6b being superposed on the troughs and peaks of the other. As a result, a totally uniform illuminance distribution can be produced on the reticle R surface and, therefore, such a uniform illuminance distribution can be produced on the surface of a wafer which is optically equivalent to the reticle surface.

The difference in the angle of incidence between the light beams, as in this example, can be produced by a beam reversing system such as at 31 in FIG. 11. Accordingly, the angular difference of the two beams to be provided by the beam reversing system is so set that the peaks and troughs of a pair of interference fringes are in a compensative or complementary relationship, on the surface to be illuminated. Since the pitch of an interference fringe can be calculated on the basis of the size of each of small lenses of the optical integrator (fly's-eye lens), the structure of the condenser lens and the like, the angular difference to be produced can be predetected by calculation.

With reference to FIG. 15, one-dimensional expansion has been considered. Actually, however, the reticle R surface has two-dimensional expansion. For this reason, it is desirable that the angular deviation is produced with respect to at least two directions, namely, orthogonal X and Y directions. To this end, as shown in FIG. 12, plural reversing systems may be used in combination.

A second method is to produce a phase distribution on the light receiving surface of the optical integrator. FIG. 16 is a schematic representation for explaining this method. The basic structure of the illumination system is similar to that of the illumination system shown in FIG. 15. In this example, however, plural laser beams are inputted to small lenses 22a and 22b at the same angle. Here, the first and second light beams have a difference with respect to the phase distribution as formed by the first light beam at the light receiving surface 22c of the small lenses 22a and 22b and the phase distribution as formed by the second light beam at the light receiving surface 22c. If the first light beam has a uniform phase distribution at the light receiving surface 22c of the small lenses 22a and 22b, as illustrated in FIG. 16, the second light beam has such a phase distribution wherein the phase is shifted by 180 degrees from the boundary between the small lenses 22a and 22b. Considering with reference to the center A on the reticle R surface, if the interference fringes as formed by the light beams from the small lenses 22a and 22b, based on the first light beam, are in a mutually intensifying condition, then the interference fringes as formed by the light beams from the small lenses 22a and 22b, based on the second light beam, are in a mutually attenuating condition, since the phase of one of the interfering lights is shifted relative to the other by 180 degrees. Accordingly, the phases of the interference fringes by the first and second light beams are in a compensative or complementary relationship, such that when they are superposed one upon another, the uniformness of light on the reticle R surface and, thus, on the wafer surface can be improved significantly.

Such a shift of the phase to the wavefront of a light by 180 degrees can be accomplished by inserting a phase difference applying member having a film formed by evaporation or the like, effective to shift the phase, into a module of incoherence transformation system such as shown in FIGS. 9A–9C.

FIGS. 17A–17C are schematic views, respectively, each showing a reversing system 31 having such a phase difference applying means 111.

FIGS. 17A and 17B each shows an example wherein a phase shift plate 111 (phase difference applying means) is inserted into the reversing system of the FIG. 9A example. If the intensity distribution of a supplied laser beam is sufficiently symmetric so that the reversing system of FIG. 9A provides the function of symmetrization and also the function of such a phase shift plate 111, the structure as illustrated in FIG. 17A or 17B is a basic form for producing complementary interference fringes with the phase distribution. If the profile of the intensity distribution of the laser beam is not good so that the reversing system cannot provide both the symmetrizing function and the phase shifting function, the phase shift plate 111 may be inserted into the second beam reversing system of FIG. 14 to provide a basic unit of the structure such as shown in FIG. 18.

In FIGS. 17A and 17B, as an example, the phase shift plate 111 may be manufactured by forming a surface height difference (112a, 112b) on a parallel flat plate 112 (see FIG. 19A) by using a film structure (hatched portion) formed by evaporation. In FIG. 19A, both faces of the parallel flat plate are covered by anti-reflection films. At the lower part 112b of the left-hand phase, an additional film is provided on the anti-reflection film, with a thickness $d=\lambda/[2(n-1)]$, wherein n is the refractive index of the film and $\lambda$ is the wavelength of the used light. Thus, the light passing through the upper part 112a and the light passing through the lower part 112b have a phase difference of 180 degrees. In place of providing a phase difference through a film, as shown in FIG. 19B, a part of a parallel flat plate 112 may be removed by etching to produce a phase difference of 180 degrees (i.e., a half wavelength), and an anti-reflection film may be formed thereon.

FIG. 17C shows an example wherein a prism block 15 constituting a beam reversing system is directly equipped with such a phase imparting means. The incoherence transformation unit as shown in FIGS. 17A–17C is provided by two-dimensionally combining the phase shifting boundary so as to suppress two-dimensionally the production of interference fringes, like the first method. For example, when the reversing system 31 of FIGS. 17A–17C is to be used in duplication, like the FIG. 10 example, one phase shift plate 111 is inserted into each reversing system. Here, it is desirable that the first and second phase shift plates are so set that their boundaries are placed in an equivalently orthogonal relationship. Further, while it depends on the structure of the lens array of the optical integrator, it is desirable that their equivalently intersecting point is in the neighborhood of the center of the optical integrator as a whole. On that occasion, it is further desirable that the boundary line is in the co-directional relationship with the array of the lens elements of the optical integrator.

The boundary of the phase shift plate is not limited to the FIG. 19A example or the FIG. 19B example, wherein it is defined by a line. As an example, it may be defined by a group of straight lines following the boundaries of the constituent elements of the optical integrator. Various modifications are possible, other than this.

FIG. 8 shows one representative embodiment, wherein a phase shift plate such as at 111 in FIG. 17A is used and wherein two stages of beam reversing systems 31 and 32 are used to direct the light to an optical integrator 3. Further, in the device of FIG. 8, in preparation for a possible difficulty in removing an interference fringe or speckle in accordance with the phase shift method, a scanner 21 is provided. If the required uniformness in the illuminance distribution is not so high, the scanner 21 may be omitted. Further, the system may be used in the manner that with regard to the X direction the phase shift plate 111 is used while, on the other hand, with regard to the Y direction perpendicular to the X direction, the angle shifting method is used.

When plural beam reversing systems are used in combination for the incoherence transformation, if a relay system such as at 25 in FIG. 13 is used as required, the combined use of these components in any manner can accomplish the object of the present invention.

The relay system 25 of FIG. 13 is particularly effective on an occasion when two light beams have a difference in the angle of emission or on an occasion when the phase shift plate 111 is used.

If the boundary of the phase shift plate sufficiently corresponds to the boundary of the individual small lenses which are the constituent elements of the optical integrator 22, without use of the relay lens 25 in FIG. 13, then use of such a relay lens is not necessary. Further, for imparting an optical path difference to the light beams for the incoherence transformation, the following relation is satisfied in the foregoing embodiments:

$$OPDn=OPD1\times 2^{n-1}$$

However, it is possible that, while taking the optical path difference OPD1 as a maximum, the arrangement may be set to satisfy the following relation:

$$OPDn=OPD1\times\tfrac{1}{2}^{n-1}$$

In such a case, the optical path difference OPDn should be made longer than the coherence length. Further, the value "$2^{n-1}$" may be replaced by "$3^{n-1}$" or any one of other values, provided that the optical path difference between mating light beams is greater than the coherence length.

In accordance with some embodiments of the present invention, light from a high-coherency light source such as a laser, for example, is passed through a reversing system or systems of the structure described above, and by this, incoherence-transformation of the light is attained. Also, the asymmetry of the intensity distribution of the laser beam itself can be corrected. Further, in the case of a pulsed laser such as an excimer laser, both the correction of non-uniformness in intensity distribution and the correction of interference fringe can be performed to each individual pulses from the excimer laser. As a result, the uniformness in illuminance distribution on the surface being illuminated can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

a light source for producing light for transferring a pattern of an original onto a substrate;

a light dividing optical system for dividing light from said light source into a plurality of light beams;

an illumination optical system including an optical integrator, said optical integrator receiving the plurality of light beams and defining a plurality of secondary light sources to illuminate the substrate; and changing means for changing the position of incidence of each of the plurality of light beams on said optical integrator, said changing means shifting the position of incidence of each of the light beams toward or away from the center of said optical integrator.

2. An apparatus according to claim 1, wherein said changing means comprises an optical member disposed on a path of the light from said light source, between said light source and said optical integrator.

3. An apparatus according to claim 2, wherein said optical member shifts the light from said light source, relative to an axis of the path of the light.

4. An apparatus according to claim 1, wherein said light dividing optical system comprises means for projecting the light beams on said optical integrator, in different directions.

5. An apparatus according to claim 1, wherein said light dividing optical system divides the light from said light source into at least four light beams, and wherein the at least four light beams are projected on said optical integrator to surround the center of said optical integrator.

6. An apparatus according to claim 5, wherein the at least four light beams are grouped into plural sets, and wherein the light beams in each set are shiftable substantially symmetrically with respect to the center of said optical integrator.

7. An apparatus according to claim 1, wherein the light beams are shiftable substantially in opposite directions, on said Optical integrator.

8. An apparatus according to claim 1, wherein said light source comprises an excimer laser, and wherein said light dividing optical system imparts at least one optical path difference in the light beams.

9. An exposure method comprising the steps of:
dividing light from a light source into a plurality of light beams;
projecting the plurality of beams onto an optical integrator to define a plurality of light sources by the optical integrator;
changing the position of incidence of each of the plurality of light beams upon the optical integrator, toward or away from the center of the optical integrator; and
illuminating, after said changing step, an original with the plurality of light sources defined by the optical integrator, to transfer a pattern of the original onto a substrate.

10. A method according to claim 9, wherein said changing step comprises (i) using an optical member disposed on a path of the light from the light source, between the light source and the optical integrator, and (ii) shifting the light from the light source by the optical member, relative to an axis of the light path.

11. A method according to claim 9, further comprising projecting the light beams on the optical integrator, in different directions.

12. A method according to claim 9, further comprising dividing the light from the light source into at least four light beams, and projecting the at least four light beams on the optical integrator to surround the center of the optical integrator.

13. A method according to claim 12, further comprising grouping the at least four light beams into plural sets, and shifting the light beams in each set substantially symmetrically with respect to the optical integrator.

14. A method according to claim 9, further comprising shifting the light beams substantially in opposite directions, on the optical integrator.

15. A method according to claim 9, further comprising using an excimer laser as the light source, and imparting at least one optical path difference in the light beams.

16. A semiconductor device manufacturing method comprising the steps of:
dividing light from a light source into a plurality of light beams;
projecting the plurality of light beams onto an optical integrator to define a plurality of secondary light sources;
changing the position of incidence of each of the plurality of light beams on the optical integrator, toward or away from the center of the optical integrator; and
illuminating, after said changing step, a mask with the plurality of secondary light sources defined by the optical integrator, to transfer a pattern of the mask onto a wafer.

17. A method according to claim 16, wherein said changing step comprises (i) using an optical member disposed on a path of the light from the light source, between the light source and the optical integrator, and (ii) shifting the light from the light source by the optical member, relative to an axis of the light path.

18. A method according to claim 16, further comprising projecting the light beam on the optical integrator, in different directions.

19. A method according to claim 16, further comprising dividing the light from the light source into at least four light beams, and projecting the at least four light beams on the optical integrator to surround the center of the optical integrator.

20. A method according to claim 19, further comprising grouping the at least four light beams into plural sets, and shifting the light beams in each set substantially symmetrically with respect to the optical integrator.

21. A method according to claim 16, further comprising shifting the light beams substantially in opposite directions, on the optical integrator.

22. A method according to claim 16, further comprising using an excimer laser as the light source, and imparting at least one optical path difference to the light beams.

23. An apparatus according to claim 1, further comprising means for imaging a pattern of the original, illuminated with the plurality of secondary light sources, upon the substrate.

24. A method according to claim 9, further comprising imaging the pattern of the original, illuminated with the plurality of secondary light sources, upon the substrate, to transfer the pattern of the original onto the substrate.

25. A method according to claim 16, further comprising imaging the device pattern of the mask illuminated with the plurality of secondary light sources, upon the wafer, to transfer the pattern of the mask onto the wafer.

26. An exposure apparatus comprising:
means for providing a plurality of light beams;
an illumination optical system including an optical integrator, said optical integrator receiving the plurality of light beams to define a plurality of secondary light sources for exposing a substrate; and
changing means for changing the position of incidence of each of the plurality of light beams upon said optical integrator, said changing means shifting the position of incidence of each beam toward or away from the center of said optical integrator.

27. An apparatus according to claim 26, further comprising means for imaging a pattern of an original, illuminated with the plurality of secondary light sources, upon the substrate.

28. A device manufacturing method, for use with an optical integrator, comprising the steps of:
changing the position of incidence of each of a plurality of light beams upon the optical integrator, toward or away from the center of the optical integrator, to define a plurality of secondary light sources by the optical integrator;

transferring, after said changing step, a device pattern onto a substrate with the plurality of secondary light sources defined by the optical integrator.

29. A method according to claim 28, wherein said transferring step comprises imaging the device pattern, illuminated with the plurality of secondary light sources, upon the substrate.

30. An exposure apparatus for exposing a substrate to a mask pattern, said apparatus comprising:

a light source for producing light;

an optical integrator for forming a plurality of secondary light sources with light from said light source;

an irradiating optical system for irradiating said optical integrator with the light from said light source, said irradiating optical system comprising first optical means for converting the light from said light source into an off-axis light beam having an optical path deviated from an optical axis of said irradiating optical system, and second optical means for changing a position of incidence of each ray of the off-axis light beam on the optical integrator, toward or away from a center of said optical integrator; and a directing optical system for directing light beams from the secondary light sources, formed by said optical integrator, onto the mask pattern.

31. An apparatus according to claim 30, wherein said first optical means comprises a plurality of beam splitters and a plurality of bending mirrors.

32. An apparatus according to claim 30, wherein the off-axis light beam consists of four light beams.

33. An apparatus according to claim 30, wherein said light source comprises an excimer laser.

34. An apparatus according to claim 30, further comprising a projection optical system for projecting an image of the mask pattern onto the substrate.

35. An exposure apparatus for exposing a substrate to a mask pattern, said apparatus comprising:

secondary light source forming means for forming a plurality of secondary light sources;

irradiating means for irradiating said secondary light source forming means with light, said irradiating means comprising means for providing off-axis light having an optical path deviated from an optical axis of said irradiating means, wherein said irradiating means is arranged so that a position of incidence of each ray of the off-axis light upon said secondary light sources forming means is changeable, toward or away from a center of said secondary light source forming means; and means for directing light beams from the secondary light sources onto the mask pattern.

36. An apparatus according to claim 35, further comprising a projection optical system for projecting an image of the mask pattern onto the substrate.

37. A device manufacturing method, for use with an optical integrator, comprising the steps of:

changing the position of incidence of each ray of an off-axis light beam upon the optical integrator, toward or away from the center of the optical integrator, to define a plurality of secondary light sources by the optical integrator; and thereafter, transferring a device pattern onto a substrate with the plurality of secondary light sources defined by the optical integrator.

38. A method according to claim 37, wherein said transferring step comprises imaging the device pattern, illuminated with the plurality of secondary light sources, upon the substrate.

* * * * *

UNITED STATES PATENT AND TRADEMARK OFFICE
CERTIFICATE OF CORRECTION

PATENT NO. : 5,463,497

DATED : October 31, 1995

INVENTOR(S) : MASATO MURAKI, ET AL.

It is certified that error appears in the above-indentified patent and that said Letters Patent is hereby corrected as shown below:

COLUMN 3:

Line 20, "descried" should read --described--.

COLUMN 7:

Line 54, "Type 1.In" should read --Type 1 in--.
Line 61, "sources" should read --source--.
Line 62, "source" should read --sources--.

COLUMN 10:

Line 16, "Of" should read --of-- and "systems-comprising" should read --system, comprising--.

COLUMN 11:

Line 4, "G value" should read --$\sigma$ value--.
Line 9, "G value" should read --$\sigma$ value--.

COLUMN 15:

Line 2, "9C" should read --9C,--.

UNITED STATES PATENT AND TRADEMARK OFFICE
CERTIFICATE OF CORRECTION

PATENT NO. : 5,463,497
DATED : October 31, 1995
INVENTOR(S) : MASATO MURAKI, ET AL.

It is certified that error appears in the above-indentified patent and that said Letters Patent is hereby corrected as shown below:

COLUMN 23:

Line 22, "Optical" should read --optical--.

COLUMN 24:

Line 19, "beam" should read --beams--.

COLUMN 26:

Line 12, "sources" should read --source--.

Signed and Sealed this

Twenty-sixth Day of March, 1996

Attest:

BRUCE LEHMAN

Attesting Officer

Commissioner of Patents and Trademarks